(12) United States Patent
Nakamura

(10) Patent No.: US 7,268,484 B2
(45) Date of Patent: Sep. 11, 2007

(54) IMAGE DISPLAY DEVICE

(75) Inventor: Hajime Nakamura, Kanagawa (JP)

(73) Assignees: Chi Mei Optoelectronics Corp. (TW);
Kyocera Corporation, Kyoto-shi (JP)

( * ) Notice: Subject to any disclaimer, the term of this patent is extended or adjusted under 35 U.S.C. 154(b) by 0 days.

(21) Appl. No.: 10/964,616

(22) Filed: Oct. 15, 2004

(65) Prior Publication Data
US 2005/0110400 A1    May 26, 2005

(30) Foreign Application Priority Data
Oct. 15, 2003    (JP) .............................. 2003-355217

(51) Int. Cl.
H05B 33/12    (2006.01)
H05B 33/04    (2006.01)

(52) U.S. Cl. ...................... 313/501; 313/504; 313/506; 313/110; 428/690

(58) Field of Classification Search ................ 313/506, 313/112, 504, 498, 512; 428/690
See application file for complete search history.

(56) References Cited

U.S. PATENT DOCUMENTS

| 5,501,926 A * | 3/1996 | Cheng et al. ................... 430/5 |
| 6,873,093 B2 * | 3/2005 | Yu et al. ...................... 313/122 |
| 6,963,168 B2 * | 11/2005 | Eida et al. .................... 313/506 |
| 2004/0054174 A1 * | 3/2004 | Nakaya et al. ................. 544/99 |
| 2005/0023966 A1 * | 2/2005 | Suh et al. ..................... 313/504 |
| 2005/0093437 A1 * | 5/2005 | Ouyang ........................ 313/506 |

FOREIGN PATENT DOCUMENTS

| JP | 2000-021570 A | 1/2000 |
| JP | 2000-315582 A | 11/2000 |
| JP | 2002-373776 A | 12/2002 |
| JP | 2003-045659 A | 2/2003 |

OTHER PUBLICATIONS

Hung et al., "Application of an Ultrathin LiF/Al Bilayer Inorganic Surface-Emitting Diodes", Applied Physics Letters, vol. 78, No. 4, Jan. 22, 2001.

* cited by examiner

Primary Examiner—Mariceli Santiago
Assistant Examiner—Anne M Hines
(74) Attorney, Agent, or Firm—Birch, Stewart, Kolasch & Birch, LLP

(57) ABSTRACT

An organic EL element has a capping layer formed on a cathode layer. The capping layer contains a pigment that absorbs light that has a wavelength that is different from a wavelength of the light emitted from a light emitting layer, and has a reflectance that is higher at interface in multi-layered structure than a reflectance of the light emitted from the light emitting layer. The capping layer prevents incident light from outside from returning to the outside of the organic EL element.

21 Claims, 19 Drawing Sheets

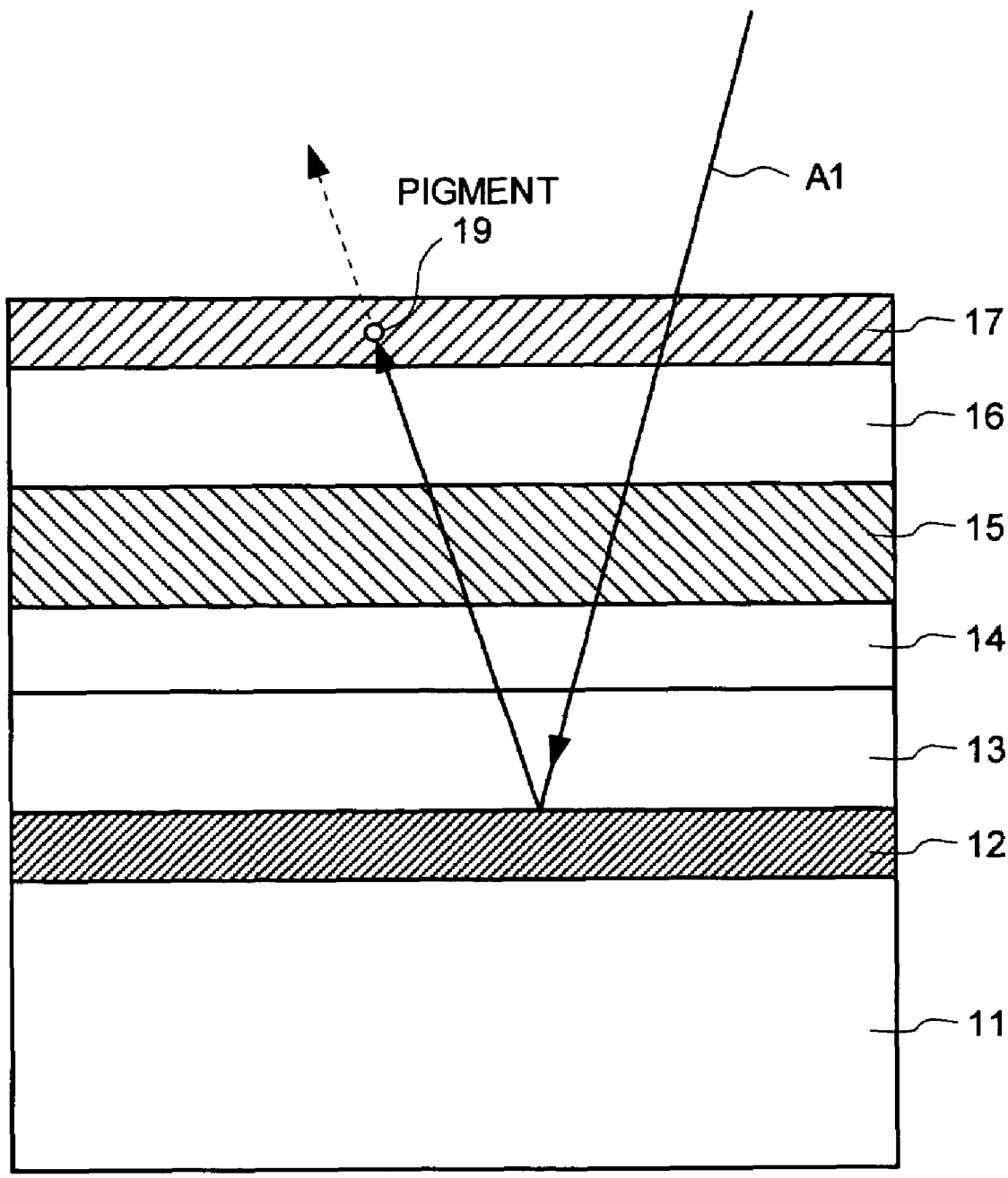

IMAGE DISPLAY DEVICE

This Nonprovisional application claims priority under 35 U.S.C. § 119(a) on Patent Application No(s). 2003-355217 filed in Japan on Oct. 15, 2003, the entire contents of which are hereby incorporated by reference.

BACKGROUND OF THE INVENTION

1) Field of the Invention

The present invention relates to an image display device with a laminated structure that includes at least an anode, a cathode, and a light emitting layer.

2) Description of the Related Art

Although liquid crystal display devices require a backlight, organic electroluminescent (EL) display devices do not require a backlight. For this reason, the organic EL display devices are ideal for thinner display devices. Moreover, the organic EL display devices do not have a limitation on the angle of visibility. For these reasons, the organic EL display devices are expected to be the image display devices of the next generation.

An organic EL display device includes an organic EL element that has at least a light emitting layer between two electrodes. Voltage is applied between the electrodes, so that the light emitting layer emits light to display an image. As the organic EL element, there is know a top emission-type organic EL element in which one of the two electrodes is made of a metal such as aluminum, and the other electrode is a semitransparent electrode of LiF/AgMg, or the like. In the top emission-type organic EL element, light emitted from the light emitting layer is transmitted through the semitransparent electrode.

However, depending on the incident angle of the light emitted from the light emitting layer, some of the light is reflected at interfaces between the layers. In such a case, only a part of the light emitted from the light emitting layer is transmitted to the outside. As a result, most of the light emitted from the light emitting layer is contained within the device and cannot be extracted, resulting in poor light extraction efficiency.

"Applied Physics Letters (Vol. 78, pp. 544-546, United States, 2001)" discloses an organic EL element having higher light extraction efficiency. In the organic EL element disclosed, a high-refraction layer, that is, a layer having higher refractive index than the laminated layer in contact with the high-refraction layer, is provided on a side of the light emitting layer from where light is emitted (hereinafter, "light emission side"). FIG. 15 is the laminated structure of a conventional organic EL element 100. The conventional organic EL element 100 includes a substrate 111, an anode layer 112 made of a metal such as Al, a buffer layer 113, a hole transporting layer 114, a light emitting layer 115 that also serves as an electron transporting layer, and a cathode layer 116 made of transparent film such as ITO film. The anode layer 112, the buffer layer 113, the hole transporting layer 114, the light emitting layer 115, and the cathode layer 116 rest on the substrate 111. This organic EL element 100 further includes a capping layer 117 on the cathode layer 116, that is, on the light emission side of the light emitting layer 115. The light emitted from the light emitting layer 115 is passes to the outside via the cathode layer 116 and the capping layer 117. Some part of the light gets reflected at the anode layer 112 and then passes to the outside via the cathode layer 116 and the capping layer 117.

The capping layer 117 is the high-refraction layer. In other words, the capping layer 117 has higher refractive index than the light emitting layer 115, which is in contact with the capping layer 117, and the cathode layer 116. Light is totally reflected when it passes from a layer with a high refractive index to a layer with a low refractive index at an angle equal to or greater than the critical angle. On the other hand, light that is incident on a layer with a high refractive index from a layer with a low refractive index is not totally reflected even if the incident angle is great, and at least part of the light can enter the layer with a high refractive index. Therefore, the light that is incident on the capping layer 117 with a higher refractive index from the cathode layer 116 with a lower refractive index is not totally reflected by the interface between the cathode layer 116 and the capping layer 117, and at least part of the light can be transmitted to the outside through the capping layer 117. Thus, the amount of light that is totally reflected by the interface between the capping layer 117 and the cathode layer 116 can be reduced.

FIG. 16 is a graph to explain how the light extraction efficiency varies with the thickness of the capping layer 117. It is assumed here that the light emitting layer 115 emits red light. The "light extraction efficiency" represents a converted value of the ratio of the luminance of light emitted in the vertical direction from the organic EL element 100 to the luminance of light within the light emitting layer 115 where the same input energy strength is applied, with the luminosity factor determined by the naked eye being taken into consideration. The "luminance" is a value obtained by multiplying the radiant intensity at each wavelength by the relative luminosity factor, and then integrating the product with the wavelength. When the thickness of the capping layer 117 is 80 nanometer (nm), the light extraction efficiency, 1.43, is maximum. The thickness of the capping layer 117 is adjusted so that the organic EL element 100 can have a light extraction efficiency of 1.40 or higher.

Thus, extraction efficiency can be improved in the conventional organic EL display device. However, an increase in reflectance cannot be prevented to maintain a reasonable luminosity factor, moreover, the contrast degrades. This problem is described in greater detail, with reference to FIGS. 17 through 20.

FIG. 17 is a graph for explaining wavelength dependency of the light extraction efficiency and the reflectance of each of organic EL elements that respectively emit red (R), green (G), and blue (B) light. Curve Lb represents the light extraction efficiency of the organic EL element that emits blue light. The curve Lg represents the light extraction efficiency of the organic EL element that emits green light. The curve Lr represents the light extraction efficiency of the organic EL element that emits red light. The curve Rb represents the reflectance of the organic EL element that emits the blue light. The curve Rg represents the reflectance of the organic EL element that emits the green light. The curve Rr represents the reflectance of the organic EL element that emits the red light. The light extraction efficiency shown in FIG. 17 is the rate of the luminance of light transmitted to the outside of the organic EL element, to the luminance of light emitted from the light emitting layer. Each reflectance shown in FIG. 17 is the rate of the luminance of light returned to the outside of the organic EL element, to the luminance of light entering from the outside.

As shown in FIG. 17, the light extraction efficiency of the organic EL element of each color is higher in the vicinity of the emission peak, and the reflectance is lower than in the other wavelength regions. For example, as indicated by the curve Lr and the curve Rr, the organic EL element that emits the red light exhibits a high light extraction efficiency and low reflectance in the wavelength region of 600 nm to 650 nm, which is the wavelength range of red light. The same applies to the organic EL element that emits the blue light and the organic EL element that emits the green light. The reflectance of each organic EL element becomes higher outside the emission peak region. For example, the organic EL element that emits the blue light and the organic EL element that emits the red light each exhibit high reflectance in the wavelength region of 520 nm to 580 nm, which is shown as a "region a" in FIG. 17. The light that belongs to the high-reflectance "region a" returns to the outside of the organic EL element 100 at a higher rate. As indicated by the transmission path A2 in FIG. 18, the light that belongs to the high-reflectance "region a" is reflected at the interface between the anode layer 112 and the buffer layer 113, and then returns to the outside of the organic EL element 100 through the capping layer 117.

FIG. 19 is a graph of relative luminosity factor with respect to wavelength. Luminosity factor, which represents the eye sensitivity to light, vary with wavelengths, and is maximum at 555 nm. A relative luminosity factor is a relative value, with the luminosity factor at 555 nm being the reference value. The light that has a wavelength that falls into the wavelength range a, exhibits a relative luminosity value of 0.8 or higher as shown in FIG. 19, and is easy to recognize with the naked eye. Accordingly, in the organic EL elements of red and blue, the light that belongs to the high-reflectance "region a" is easy to recognize with the naked eye.

Especially in the organic EL elements that emit red and blue lights, it is considered that the light of the "region a", which is returned to the outside of the organic EL element 100, is recognized with the naked eye as light having a higher luminance than it actually has. FIG. 20 is a graph for explaining the dependency of the reflectance on the thickness of the capping layer 117. The reflectance is obtained by multiplying the reflectance shown in FIG. 17 and the relative luminosity factor, and then integrating the product with the wavelength. As shown in FIG. 20, with the luminosity factor being taken into consideration, the reflectance is as high as 0.62 when the thickness of the capping layer 117 is 80 nm, with which the light extraction efficiency becomes the highest. Although not shown, the same applies to the organic EL element that emits blue light.

As described above, in the conventional organic EL element 100, the reflectance of the light outside the emission peak region is high, even where the reflectance of light in the emission peak region is low. Especially in organic EL elements that emit red or blue light, the reflectance is high in the "region a" that exhibits a high luminosity factor. Accordingly, in such organic EL elements, reflected external light is strongly visible to the naked eye. As a result, the reflected external light is added to the light on the display screen of the organic EL element 100, which results into degradation of contrast of an image to be displayed.

SUMMARY OF THE INVENTION

It is an object of the present invention to solve at least the problems in the conventional technology.

An image display device according to an aspect of the present invention has a multi-layered structure including an anode, a cathode, and a light emitting layer. The image display device further includes an absorbing layer that is arranged on a side of the light emitting layer from which light is emitted, wherein the absorbing layer has higher refractive index than at least one of a refractive index of the light emitting layer and refractive indices of more than one layer of the multi-layered structure that is located on the side of the light emitting layer from which light is emitted, and absorbs light that has a wavelength which is different from a wavelength of the light emitted from the light emitting layer, and a reflectance that is higher at interfaces of the multi-layered structure than a reflectance of the light emitted from the light emitting layer.

An image display device according to another aspect of the present invention has a multi-layered structure including an anode, a cathode, and a light emitting layer. The image display device further includes an absorbing layer that absorbs light that has a wavelength which is different from a wavelength of the light emitted from the light emitting layer, and a reflectance that is higher at interfaces of the multi-layered structure than a reflectance of the light emitted from the light emitting layer.

An image display device according to still another aspect of the present invention has a multi-layered structure including an anode, a cathode, and a light emitting layer that emits light of a predetermined wavelength. The light emitting layer absorbs light that has a wavelength which is different from a wavelength of the light emitted from the light emitting layer, and a reflectance that is higher at interfaces of the multi-layered structure than a reflectance of the light emitted from the light emitting layer.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a schematic for explaining a transmission path of light that enters the organic EL element shown in FIG. 1;

DETAILED DESCRIPTION

Figure 1:
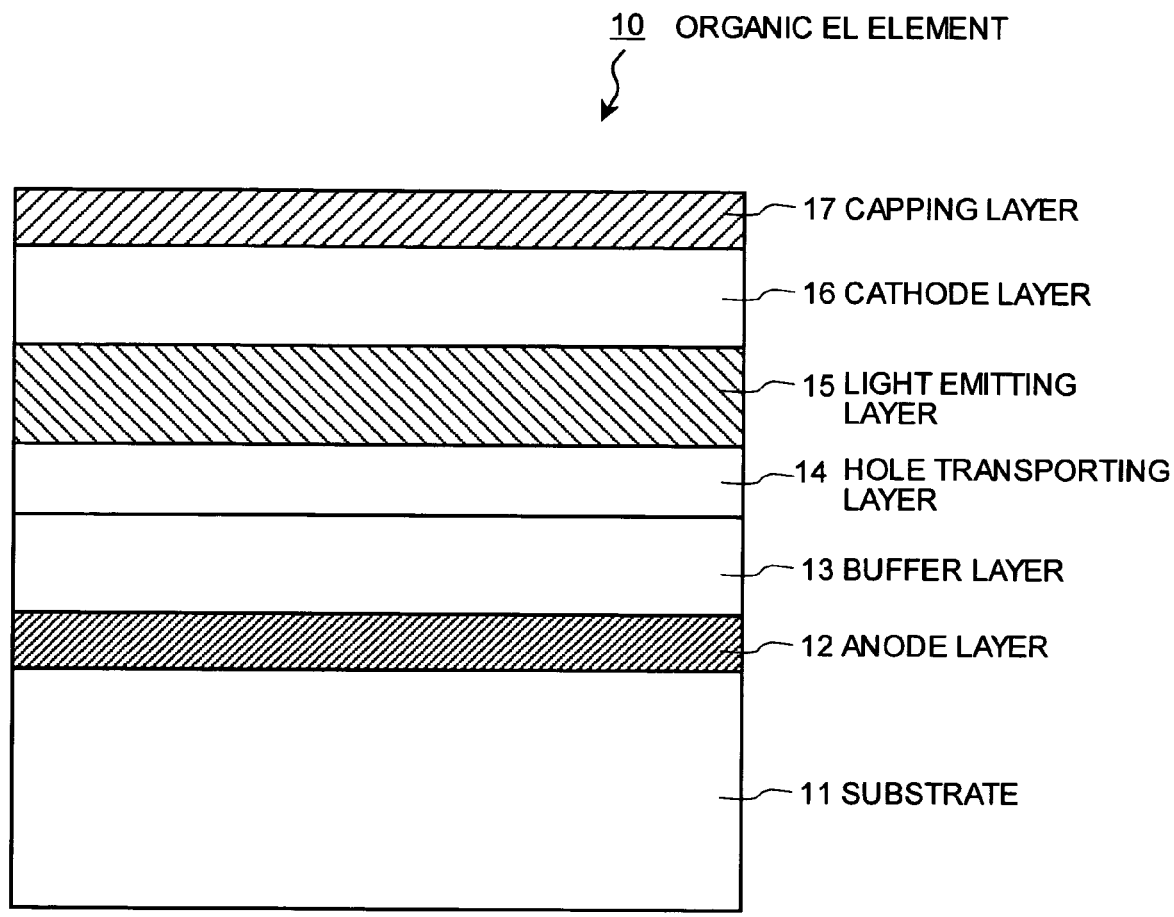
FIG. 1 is a cross section of an organic EL element according to a first embodiment of the present invention.

Exemplary embodiments of an image display device according to the present invention will be explained below with reference to the accompanying drawings. The image display device is an organic EL display device that employs organic EL elements. However, the present invention is not limited by the embodiments described below. In the accompanying drawings, like components are denoted by like reference numerals. Also, these drawings are merely schematic, and it should be understood that the thickness and the width of each layer and the ratio of each layer to the entire structure might differ from the actual measurements. There might be some errors in the measurements and ratios between the drawings.

First, an organic EL display device according to a first embodiment of the present invention is described. An organic EL element of the first embodiment has a capping layer that has a predetermined refractive index and contains a pigment that absorbs light of predetermined wavelengths. With such a capping layer, incident light in the organic EL element is more effectively prevented from returning to the outside. FIG. 1 illustrates a structure of an organic EL element 10 according to the first embodiment. The organic EL display device 10 has a structure in which organic EL elements corresponding to red, green, and blue are arranged two-dimensionally in predetermined order.

The organic EL element 10 includes an anode layer 12, a buffer layer 13, a hole transporting layer 14, a light emitting layer 15 that also serves as an electron transporting layer, and a cathode layer 16. All of these layers rest on a substrate 11. The organic EL element 10 further includes a capping layer 17 above the cathode layer 16. It is assumed here that the organic EL element 10 is a top-emission type device, that is a device in which light emitted from the light emitting layer 15 is directly transmitted to the outside or is reflected by the anode layer 12 and then transmitted to the outside via the cathode layer 16 and the capping layer 17.

The anode layer 12 functions as an anode that supplies holes to the light emitting layer 15. The anode layer 12 is made of a material with high reflectance. The buffer layer 13 reduces short-circuiting due to the unevenness of the surface of the anode layer 12. The buffer layer 13 also facilitates hole injection from the anode layer 12 into the hole transporting layer 14, having a work function between those of the anode layer 12 and the hole transporting layer 14. The hole transporting layer 14 is an organic compound layer that transports holes injected from the anode layer 12 to the light emitting layer 15. The light emitting layer 15 is made of an organic compound, and emits red, green, or blue light. More specifically, the holes or electrons are injected into the anode layer 12 and the cathode layer 16, respectively, when an electric field is generated between the anode layer 12 and the cathode layer 16. The holes and the electrons then recombine to emit red, green, or blue light. The light emitting layer 15 also functions as an electron transporting layer that transports the electrons injected from the cathode layer 16 to the light emitting layer 15. It is assumed here that the light emitting layer 15 emits the red light. The cathode layer 16 functions as a cathode that supplies electrons to the light emitting layer 15. The cathode layer 16 is made of semi-transparent metal film.

The capping layer 17 is formed on the cathode layer 16. Accordingly, the capping layer 17 is in contact with the cathode layer 16 at the incident side of the light emitted from the light emitting layer 15. The capping layer 17 is made of a high-refraction film having a higher refractive index than the cathode layer 16 and the light emitting layer 15. For example, zinc sulfide (ZnS) having a refractive index of 2.38 is employed for the capping layer 17. When light is transmitted from a layer with a low refractive index to a layer with a high refractive index, the light is not totally reflected, even if the incident angle is great. Accordingly, the light can be at least partially transmitted to the layer with a high refractive index. In the organic EL element 10, light that is transmitted from the cathode layer 16 to the capping layer 17 having a higher refractive index than the cathode layer 16 is not totally reflected by the interface between the cathode layer 16 and the capping layer 17, and the light can be at least partially transmitted to the outside through the capping layer 17. Thus, the capping layer 17 reduces the amount of light reflected by the interface between the capping layer 17 and the cathode layer 16, and increases the light extraction efficiency.

Figure 2A:
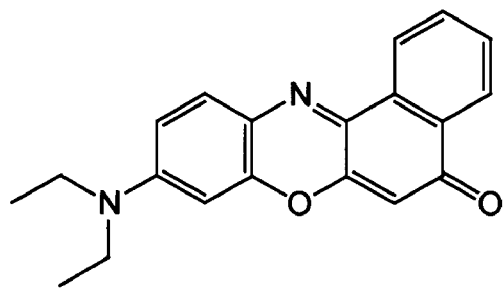
FIG. 2A is the molecular structure of Nile Red pigment.
Figure 2B:
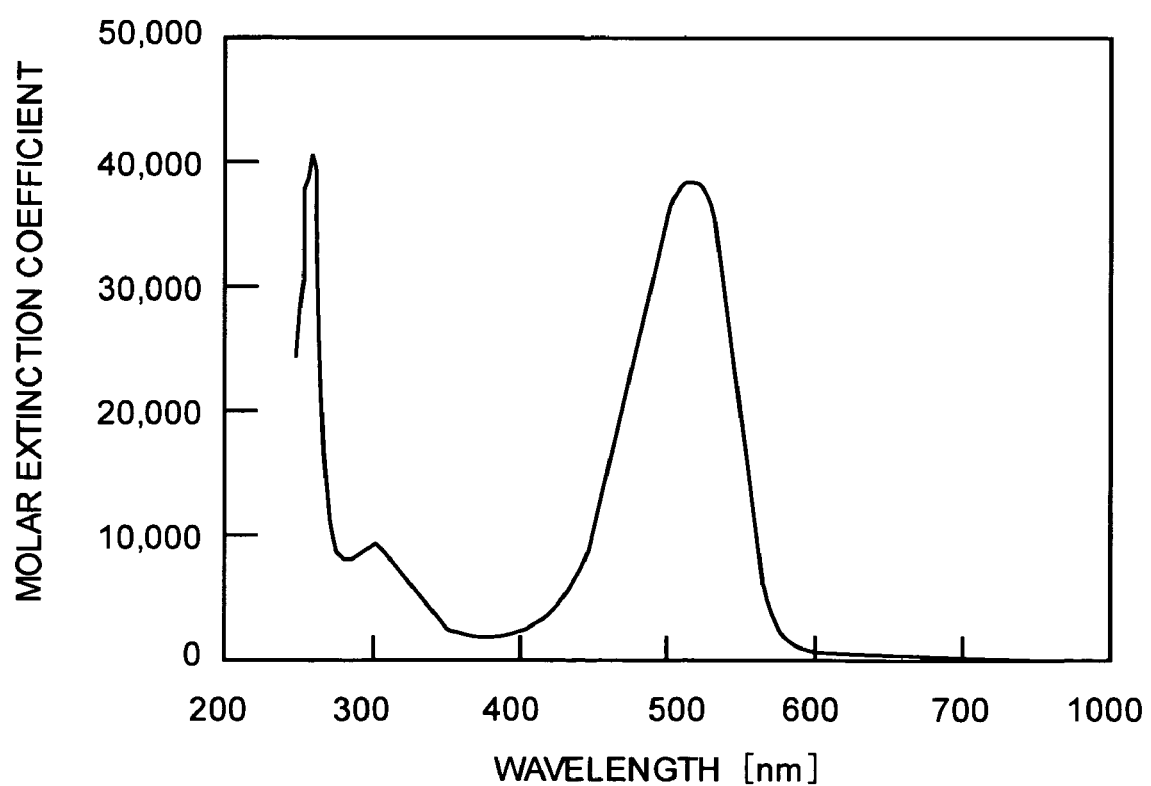
FIG. 2B is a graph for explaining wavelength dependency of molar extinction coefficient of the Nile Red pigment.

The capping layer 17 contains "Nile Red" pigment that has a molecular structure shown in FIG. 2A. Any other pigment having similar molecular structure may be used. The Nile Red pigment is added to the capping layer 17 at a concentration of 10%. FIG. 2B is a graph for explaining wavelength dependency of molar extinction coefficient of the Nile Red pigment. A molar extinction coefficient represents the absorbance per 1 mol/dm$^{-3}$ of chemical species. In FIG. 2B, the molar extinction coefficient is plotted with respect to the wavelength. In other words, FIG. 2B illustrates the absorption spectrum of the Nile Red pigment. As clear from FIG. 2B, the pigment strongly absorbs light of 500 nm to 560 nm in wavelength. Therefore, when such a light enters the organic EL element 10 from outside, it is mostly absorbed by the Nile Red pigment in the capping layer 17, when it passes through the capping layer 17 or after reflected by the interface between the cathode layer 12 and the buffer layer 13. Thus, such a light is not returned to the outside of the organic EL element 10. The light of 500 nm to 560 nm in wavelength to be absorbed by the Nile Red pigment has a higher chance of being transmitted to the outside of the organic EL element than the light emitted from the light emitting layer in a conventional organic EL element that emits the red light. Also, the light having wavelength 500 nm to 560 nm exhibits a high luminosity factor. Accordingly, the capping layer 17 has a function of absorbing such a light, which has a higher luminosity factor than the rest of the light that enters from the outside. Thus, the capping layer 17 reduces the amount of light to be returned to the outside of the organic EL element 10.

Figure 4:
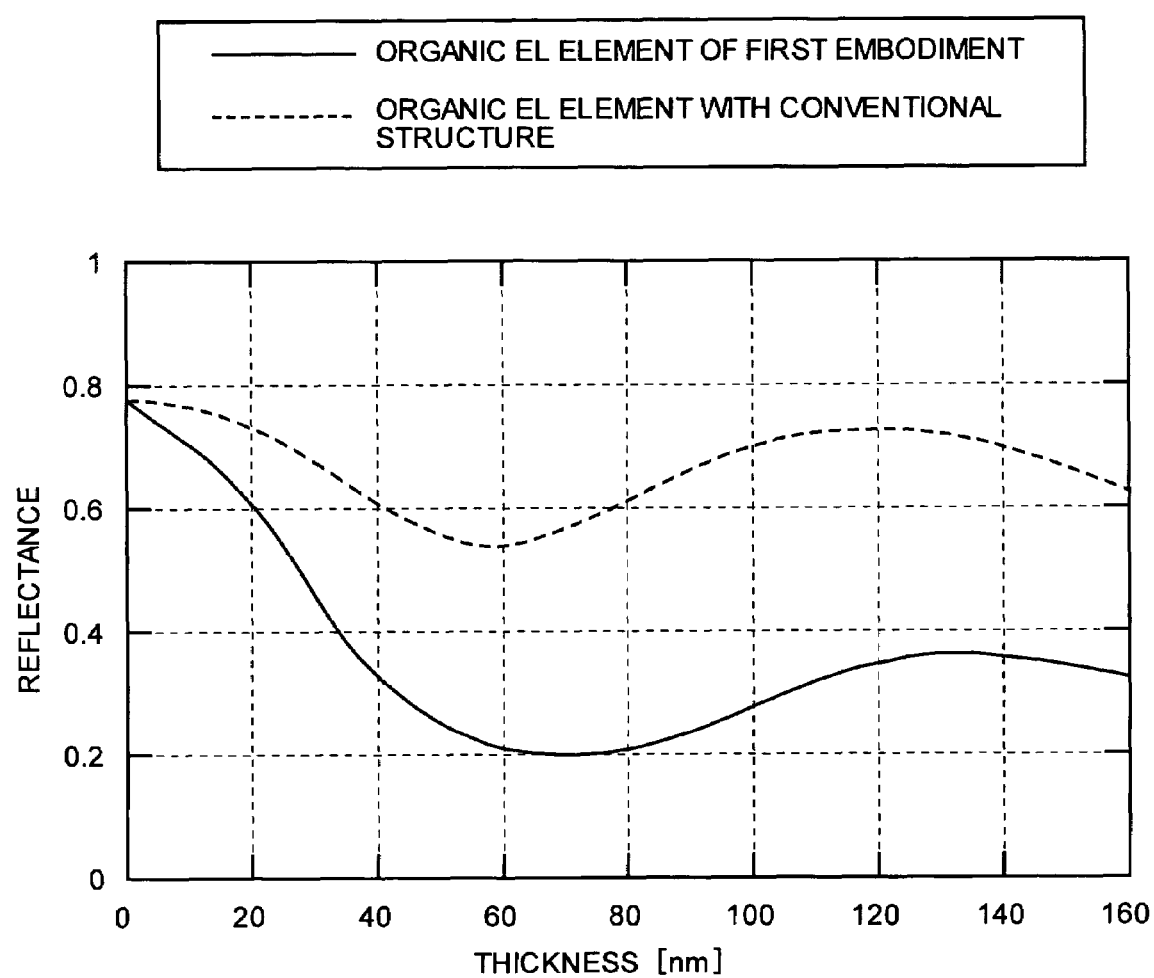
FIG. 4 is a graph for explaining variations in reflectance with thickness of the capping layer of the organic EL element shown in FIG. 1.

FIG. 4 is a graph for explaining variations in the reflectance with the thickness of the capping layer 17. Here, the reflectance is described as the ratio of light returned to the outside of the organic EL element 10 to incident light from outside, with the luminosity factor being taken into consideration. For example, the reflectance is a value obtained by multiplying the ratio of light returned to the outside of the organic EL element 10 to the incident light from outside and the relative luminosity factor, and then integrating the product with the wavelength. A so-called "C light source" is used as the source of the incident light from outside. As well as the reflectance of the organic EL element 10, FIG. 4 is the reflectance of an organic EL element with a conventional structure that includes a capping layer not containing a pigment such as Nile Red.

As shown in FIG. 4, the reflectance of the conventional organic EL element only exhibits the smallest value of 0.54 where the thickness of the capping layer is 60 nm. Regardless of the thickness of the capping layer, the reflectance of the conventional organic EL element exhibits a large value. On the other hand, the reflectance of the organic EL element 10 is much smaller than that of the conventional organic EL element. More specifically, where the thickness of the capping layer 17 is 60 nm to 80 nm, the reflectance of the organic EL element 10 is 0.22 or lower. Where the thickness of the capping layer 17 is 70 nm, the reflectance of the organic EL element 10 becomes as low as 0.20. Accordingly, the organic EL element 10 can more effectively prevent the reflected light with a high luminosity factor from returning to the outside, and can thus reduce the reflectance. This is because the organic EL element 10 includes the capping layer 17 containing the Nile Red pigment.

Figure 5:
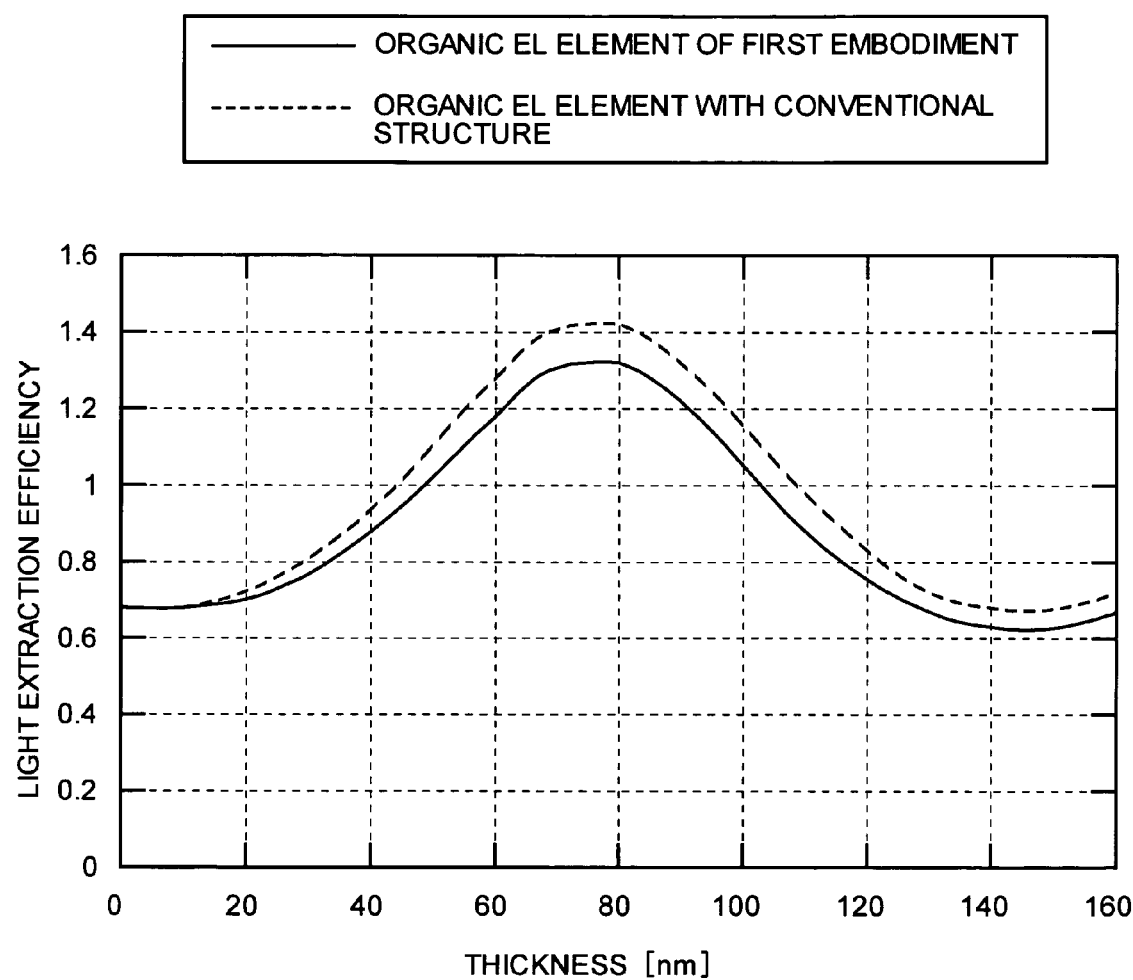
FIG. 5 is a graph for explaining variations in light extraction efficiency with thickness of the capping layer of the organic EL element shown in FIG. 1.

FIG. 5 is a graph for explaining variation in the light extraction efficiency of the organic EL element 10 with the thickness of the capping layer 17. Here, the light extraction efficiency is described as a converted value of the ratio of the luminance of light emitted in the vertical direction from an organic EL element to the luminance of light within the light emitting layer where the same input energy strength is applied, with the luminosity factor determined by the naked eye being taken into consideration. The "luminance" is a value obtained by multiplying the radiant intensity at each wavelength by the relative luminosity factor, and then integrating the product with the wavelength. FIG. 5 is the light extraction efficiency of an organic EL element with a conventional structure, as well as the light extraction efficiency of the organic EL element 10. As shown in FIG. 5, where the thickness of the capping layer 17 is 60 nm to 80 nm and the reflectance is low, the light extraction efficiency of the organic EL element 10 is 1.2 or higher. Where the thickness of the capping layer 17 is 80 nm, the light extraction efficiency of the organic EL element 10 becomes as high as 1.32, which is the highest value. Accordingly, the organic EL element 10 can maintain high light extraction efficiency.

Figure 6A:
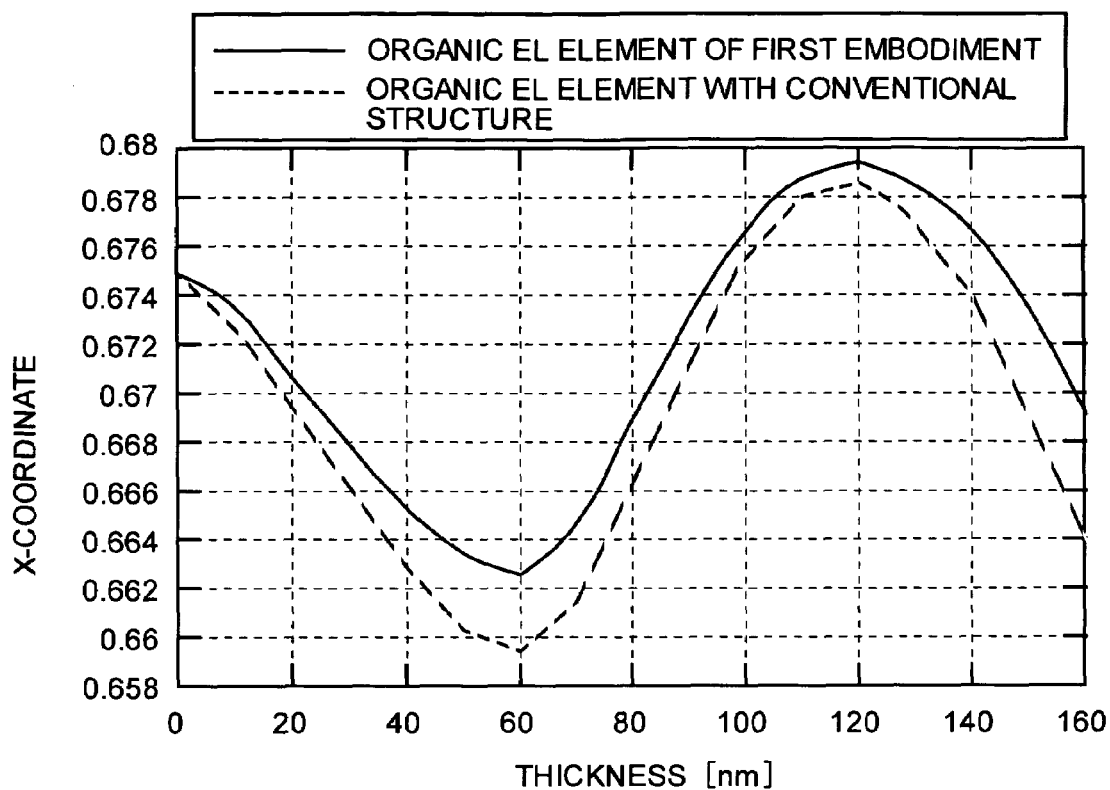
FIG. 6A is a graph for explaining x-coordinate variations in color coordinates of the light emitted from the organic EL element with the thickness of the capping layer of the organic EL element shown in FIG. 1.
Figure 6B:
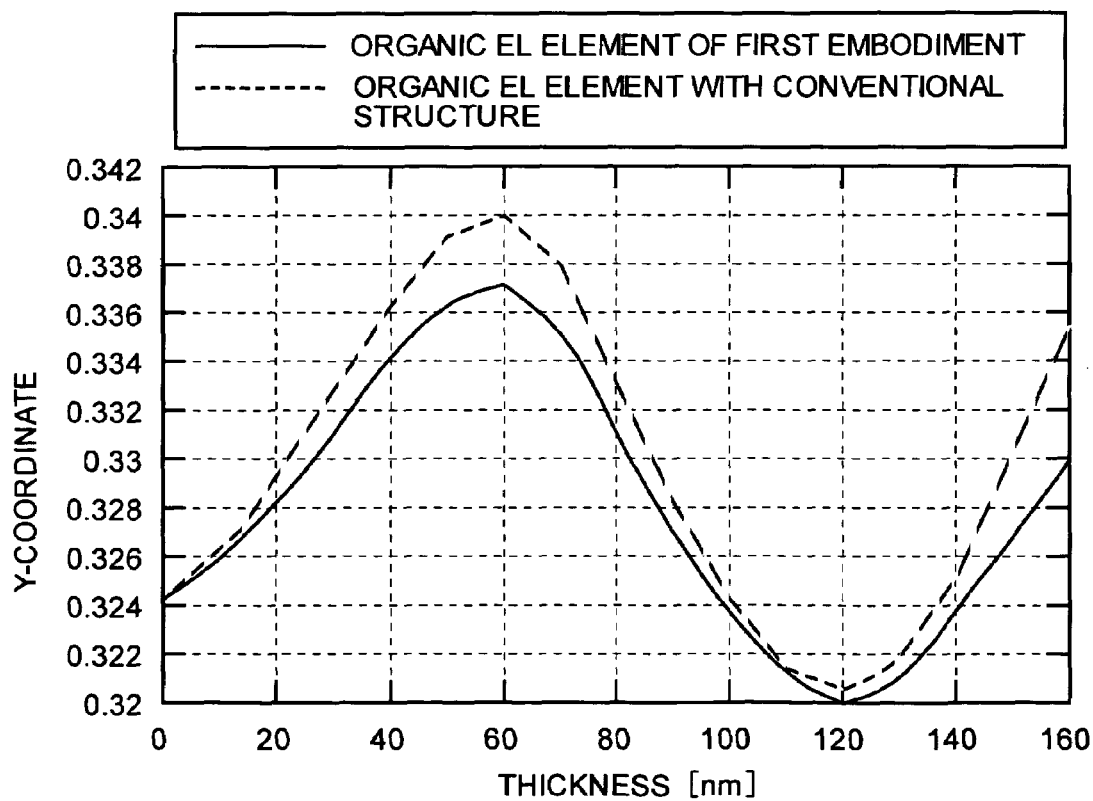
FIG. 6B is a graph for explaining y-coordinate variations in color coordinates of the light emitted from the organic EL element with the thickness of the capping layer of the organic EL element shown in FIG. 1.

FIGS. 6A and 6B show variations in the color coordinates (according to CIE1931) of light emitted from the organic EL element 10 and the conventional organic EL element with respect to the thickness of the capping layer. FIG. 6A is x-coordinate variations in the color coordinates, and FIG. 6B is y-coordinate variations in the color coordinates. Where the capping layers of the organic EL element 10 and the conventional EL element have the same thickness, the values on the x-coordinate and the y-coordinate exhibit only small differences of 0.003 or so between the organic EL element 10 and the conventional EL element, as shown in FIGS. 6A and 6B. Such small differences do not affect the visibility. Accordingly, even with the capping layer 17 containing the Nile Red pigment, the values on the color coordinates of light emitted from the organic EL element 10 do not greatly fluctuate. Thus, the organic EL element 10 can steadily emit the red light.

As mentioned above, because the capping layer 17 contains the Nile Red pigment, the light having a higher reflectance at the interface and a higher luminosity factor than the light emitted from the light emitting layer 15 is more effectively prevented from returning to the outside of the organic EL element 10, and the reflectance can be reduced, accordingly. As a result, the organic EL element 10 can be employed to produce an organic EL display device that can display high-quality images with less degradation of contrast. Also, since the capping layer 17 is a high-refraction layer having a higher refractive index than the cathode layer 16 and the light emitting layer 15, the amount of light to be reflected by the interface in contact with the capping layer 17 can be reduced. Thus, the organic EL element 10 can maintain high light extraction efficiency.

Although it has been mentioned above that the capping layer 17 is provided on the cathode layer 16, the capping layer 17 may be placed anywhere on the light emitting side of the light emitting layer 15. For example, the capping layer 17 may be provided between the light emitting layer 15 and the cathode layer 16. In this case, most of the incident light from outside is reflected by the interface between the anode layer 12 and the buffer layer 13, and the reflected light passes through the buffer layer 13, the hole transporting layer 14, the light emitting layer 15, and the cathode layer 16, to the outside of the organic EL element 10. The capping layer 17 also has a function of increasing the light extraction efficiency. Therefore, the reflectance can be reduced, as long as the capping layer 17 containing the Nile Red pigment is located in the light transmission path through which the reflected light goes out of the organic EL element 10 or in the light transmission path through which the light emitted from the light emitting layer 15 goes out of the organic EL element 10. With the capping layer 17 located in one of the light transmission paths, most of the reflected light of 500 nm to 560 nm in wavelength is absorbed by the Nile Red pigment contained in the capping layer 17. As a result, only a very small quantity of light of the above wavelengths is transmitted to the outside. The refractive index of the capping layer 17 should be higher than the layer with which the capping layer 17 is in contact on the incident side of the light emitted from the light emitting layer 15. Therefore, where the capping layer 17 is located on the light emission side of the light emitting layer 15, the refractive index of the capping layer 17 should be higher than at least one of the light emitting layer 15 and the layer located on the light emission side of the light emitting layer 15.

Next, a second embodiment of the present invention is described. The organic EL element of the first embodiment has a capping layer containing a pigment that absorbs light of predetermined wavelengths. On the other hand, in an organic EL element according to a second embodiment, a light emitting layer contains the pigment.

Figure 7:
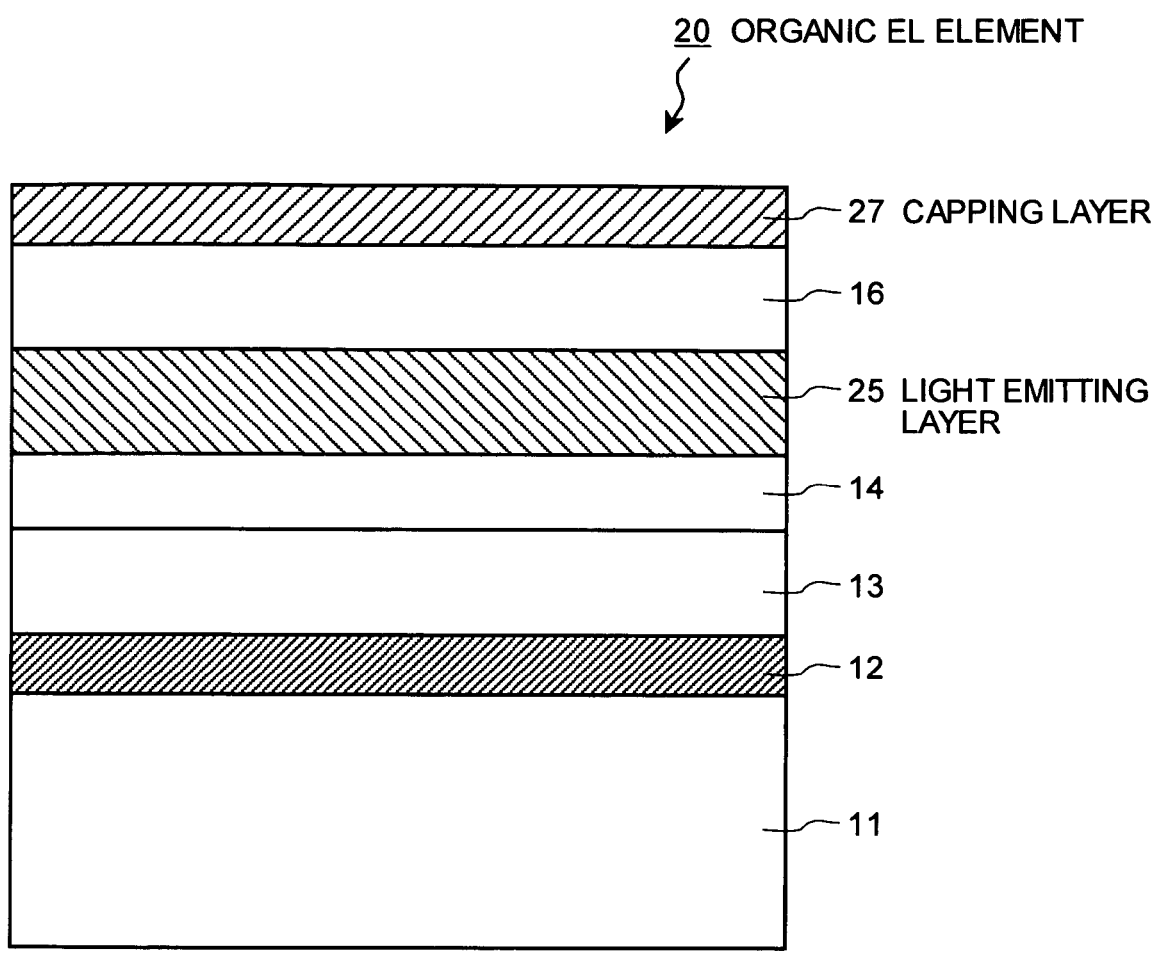
FIG. 7 is a cross section of an organic EL element according to a second embodiment of the present invention.

FIG. 7 is a structure of an organic EL element 20 according to the second embodiment. In the organic EL element 20, a light emitting layer 15 contains the Nile Red pigment. A capping layer 27 is made of a high-refraction film having a higher refractive index than the cathode layer 16 and the light emitting layer 15. For example, the capping layer 27 is formed with zinc sulfide (ZnS) that has a refractive index of 2.38. The capping layer 27 does not contain the Nile Red pigment. The light emitting layer 15 is described as a layer that emits the red light.

Figure 8:
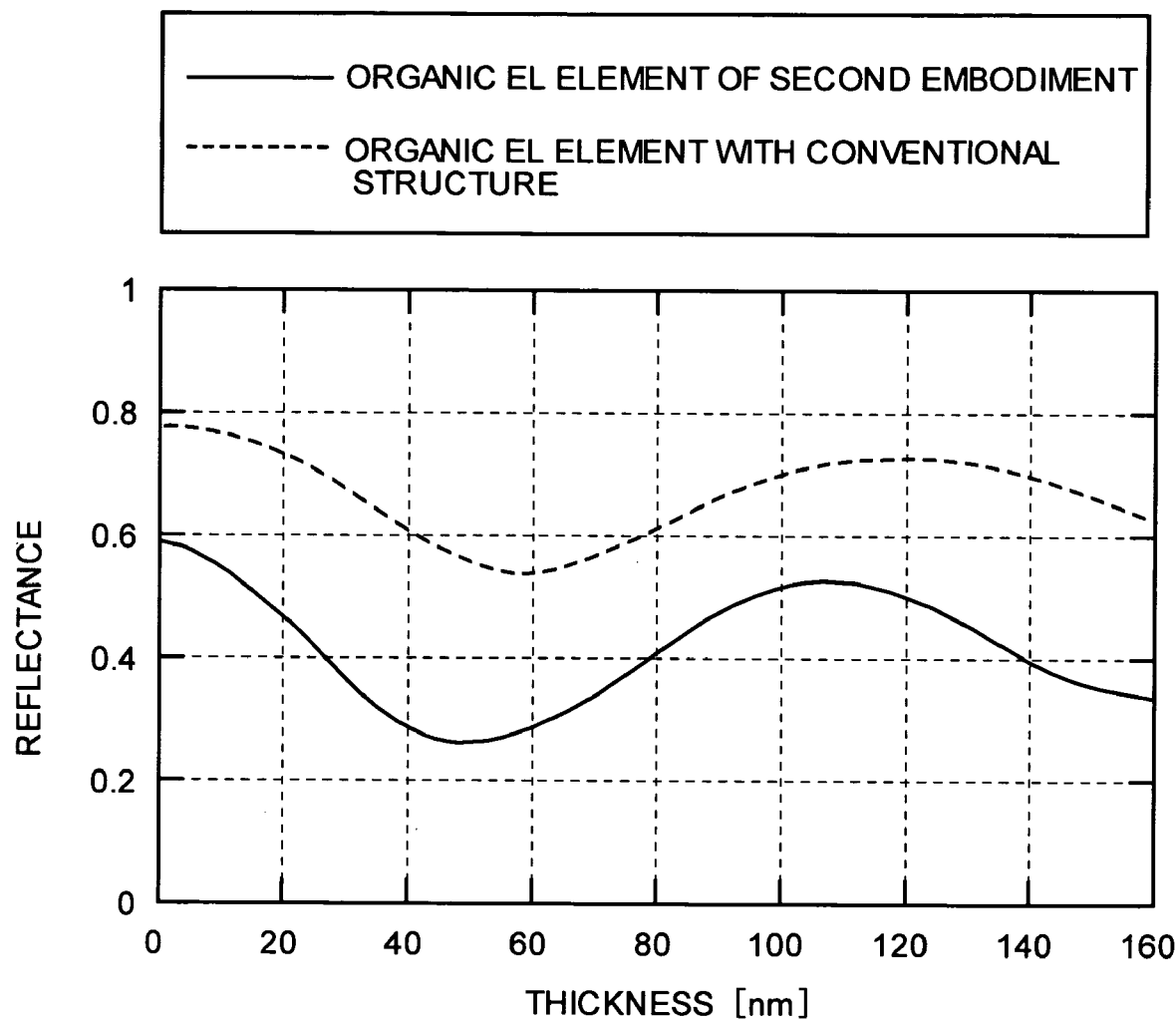
FIG. 8 is a graph for explaining variations in reflectance with thickness of the capping layer of the organic EL element shown in FIG. 7.
Figure 9:
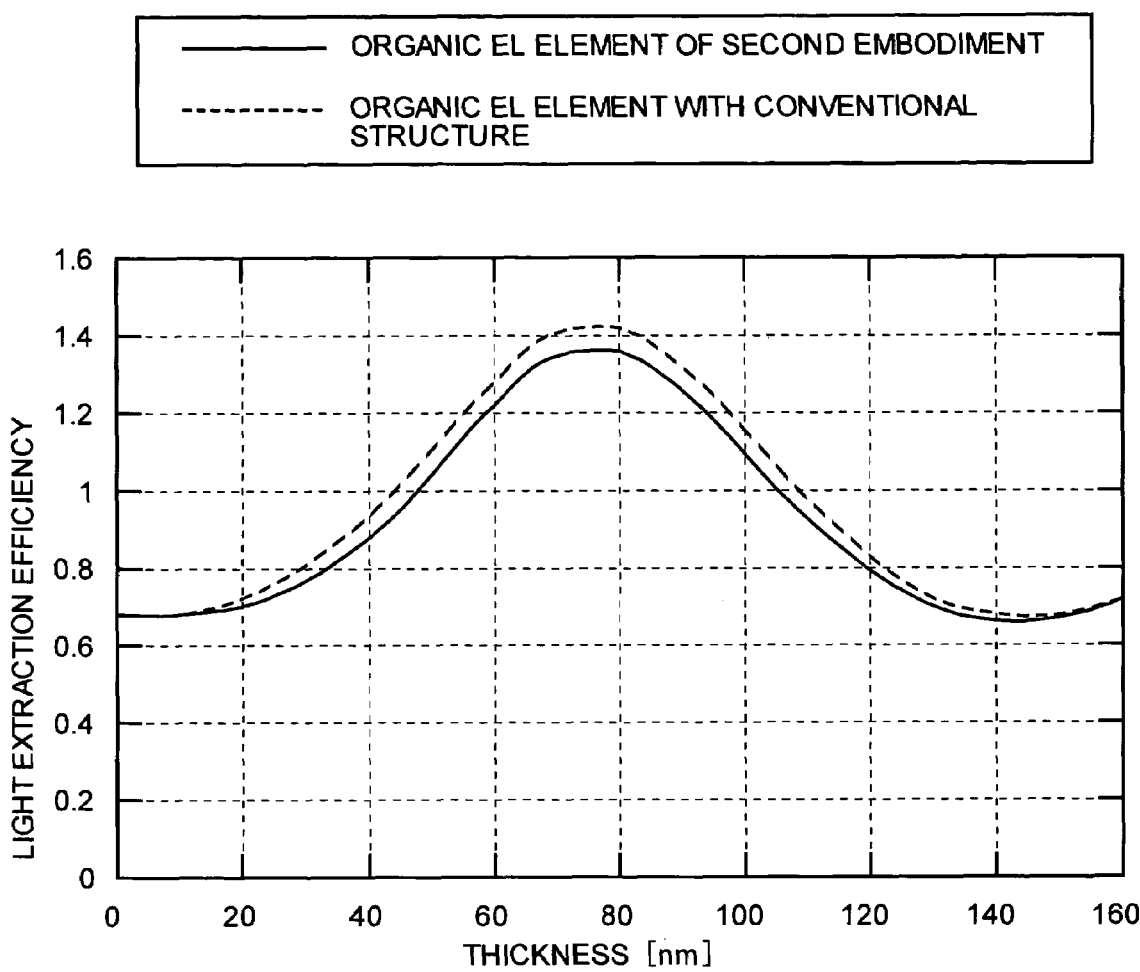
FIG. 9 is a graph for explaining variations in light extraction efficiency with thickness of the capping layer of the organic EL element shown in FIG. 7.

FIG. 8 is a graph for explaining variations is reflectance of the organic EL element 20 and a conventional organic EL element with the thickness of the capping layer 27. The conventional organic EL element is the one that has a light emitting layer that does not contain the Nile Red pigment. As shown in FIG. 8, the organic EL element 20 exhibits a lower reflectance than the conventional organic EL element. As mentioned in the description of the first embodiment, the light to be absorbed by Nile Red pigment contained in the light emitting layer 25 does not include the red light emitted from the light emitting layer 25. The incident light to be absorbed by Nile Red pigment has a higher chance of being reflected by the interface than the red light, and also has a high luminosity factor. The light absorbed by Nile Red pigment is not returned to the outside of the organic EL element 20, and accordingly, the reflectance of the organic EL element 20 is greatly reduced. FIG. 9 is a graph for explaining variations in the light extraction efficiency of the organic EL element 20 and the conventional organic EL element, with the thickness of the capping layer 27. As clear from FIG. 9, the light extraction efficiency of the organic EL element 20 is almost the same as the light extraction efficiency of the conventional organic EL element. In other words, the organic EL element 20 has light extraction efficiency as high as the conventional organic EL element.

As described above, since the organic EL element 20 has the light emitting layer 25 that contains the Nile Red pigment, the organic EL element 20 has a lower refractive index than the conventional organic element, and can achieve the same effects as the first embodiment.

Figure 10:
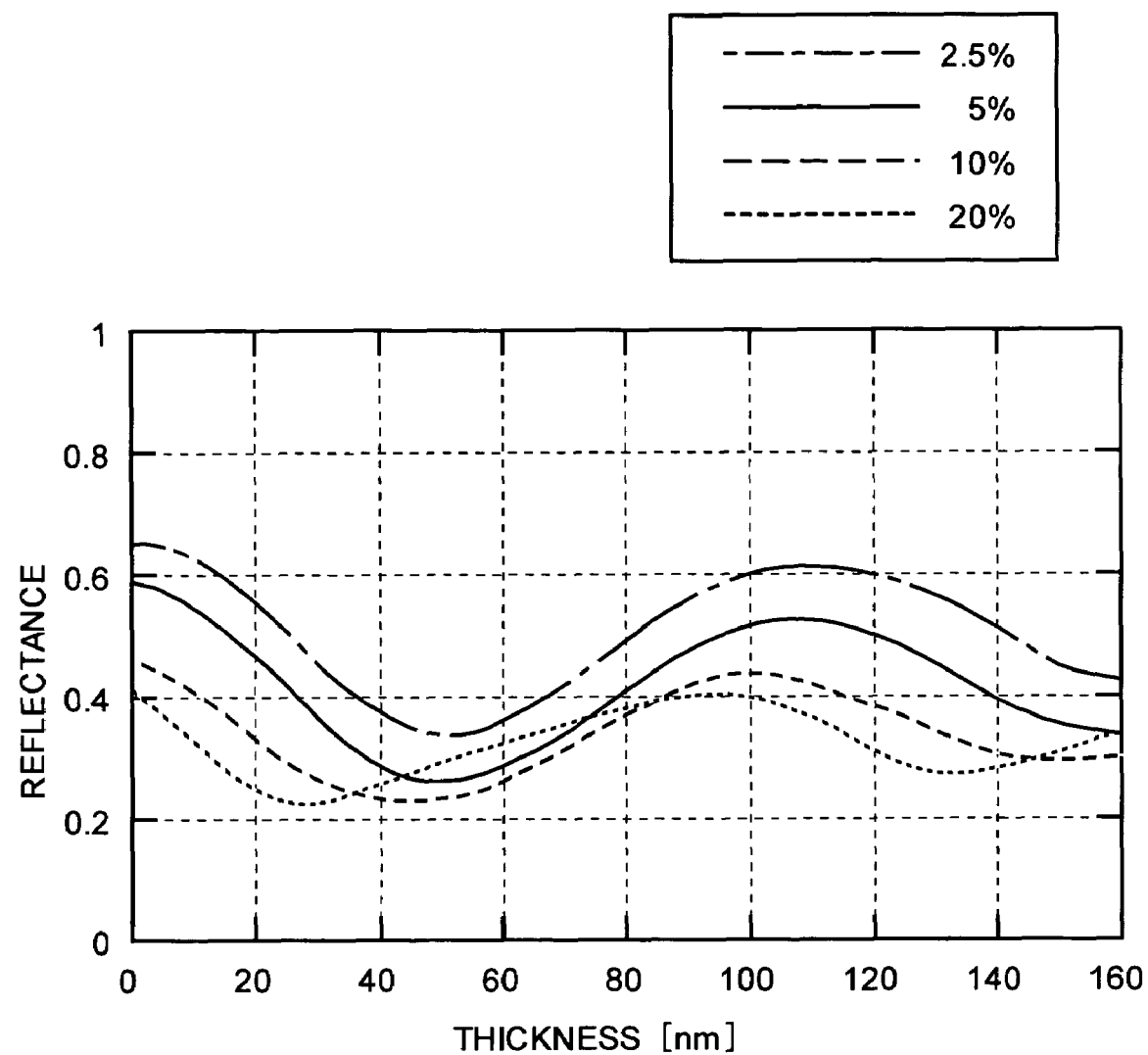
FIG. 10 is a graph for explaining variations in reflectance with thickness of the capping layer of the organic EL element shown in FIG. 7.
Figure 11:
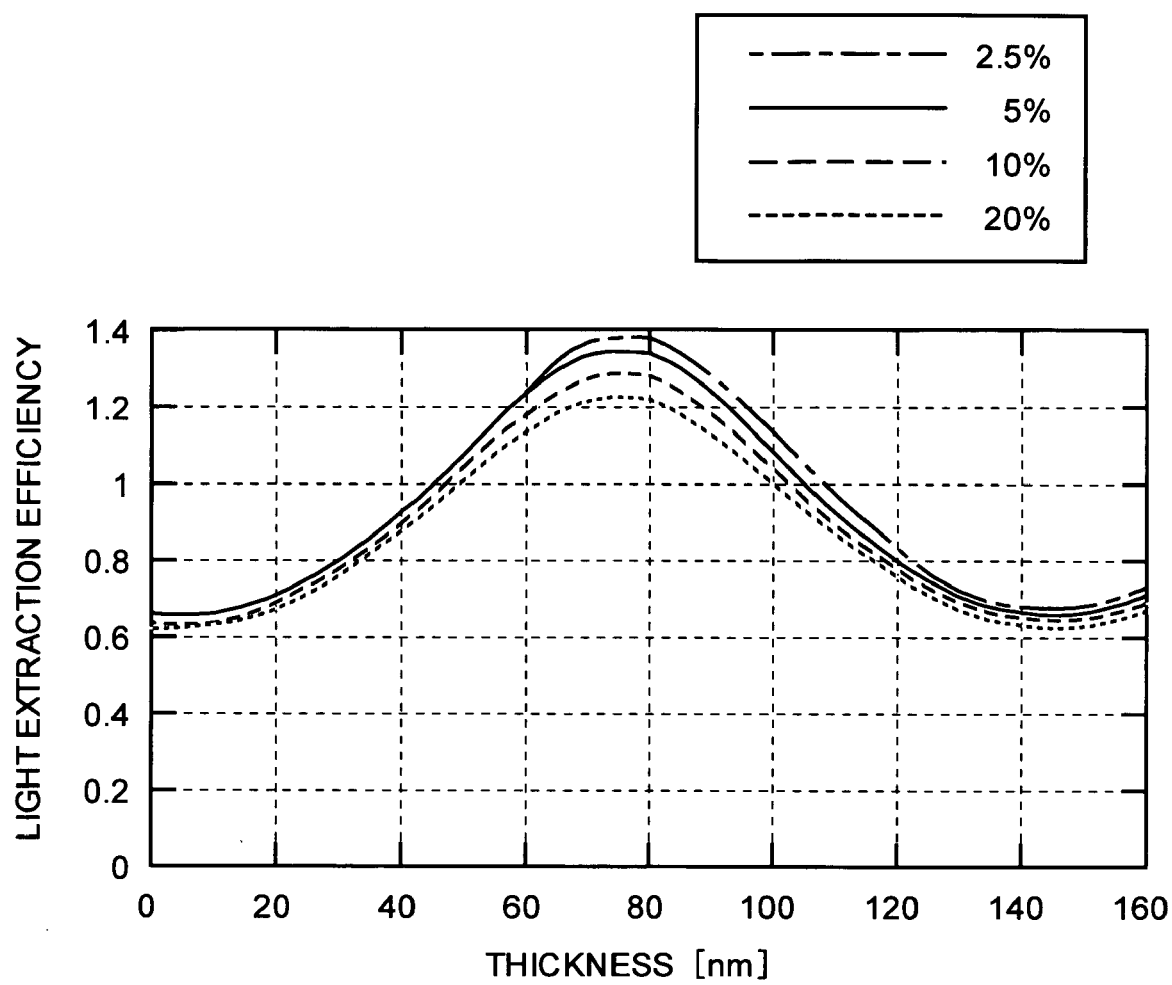
FIG. 11 is a graph for explaining variations in light extraction efficiency with thickness of the capping layer of the organic EL element shown in FIG. 7.

Next, an explanation is given on how much Nile Red pigment is desirable in the light emitting layer 25. FIG. 10 is a graph for explaining how the reflectance of the organic EL element 20 changes with the thickness of the capping layer 27. Nile Red pigment was added to the light emitting layer 25 at concentrations of 2.5%, 5%, 10%, and 20%. FIG. 11 is the dependency of the light extraction efficiency of the organic EL element 20 on the thickness of the capping layer 27. Here, Nile Red is also added to the light emitting layer 25 at concentrations of 2.5%, 5%, 10%, and 20%.

As shown in FIG. 10, when the concentration of the Nile Red pigment is 20%, the smallest value of the reflectance is 0.23 with the thickness of the capping layer 27 being 30 nm. When the concentration of the Nile Red pigment is 10%, the smallest value of the reflectance is 0.21 with the thickness of the capping layer 27 being 40 nm. When the concentration of the Nile Red pigment is 5%, the smallest value of the reflectance is 0.26 with the thickness of the capping layer 27 being 50 nm. When the concentration of the Nile Red pigment is 2.5%, the smallest value of the reflectance is 0.33 with the thickness of the capping layer 27 being 50 nm. This means that, the capping layer 27 can be made thinner when the amount of the Nile Red pigment is higher. A thinner capping layer gives a greater degree of freedom in design of the laminated structure. Also, when the concentration of the Nile Red pigment is lower, the reflectance tends to become higher than when the concentration is higher. This is presumably because a large amount of light of the predetermined wavelengths that is incident on the light emitting layer 25 is not absorbed by the small amount of the Nile Red pigment contained in the light emitting layer 25. As a result, a larger amount of light is returned to the outside of the organic EL element 20.

The light extraction efficiency shown in FIG. 11 becomes lower as the concentration of the Nile Red pigment becomes higher. For example, when the concentration of the Nile Red pigment is 20%, the greatest value of the light extraction efficiency is 1.22 with the thickness of the capping layer 27 being 70 nm. When the concentration of the Nile Red pigment is 2.5%, the greatest value of the light extraction efficiency is 1.39 with the thickness of the capping layer 27 being 80 nm. Therefore, when the light extraction efficiency is taken into consideration, it is preferable to add Nile Red at a low concentration.

As can be seen from FIGS. 10 and 11, preferable concentration of the Nile Red pigment is 5% to 10% for obtaining desirable light extraction efficiency and reflectance. Even if the thickness of the capping layer 27 is set at 70 nm to increase the light extraction efficiency, the value of the reflectance is 0.32 to 0.35, which is lower than the reflectance obtained with a conventional organic EL element in the same situation. In this manner, the reflectance and the light extraction efficiency can be suitably set by adjusting the concentration of Nile Red to be added to the light emitting layer 25 and the thickness of the capping layer 27.

Light of the predetermined wavelengths is absorbed by the Nile Red pigment added to the light emitting layer 25, and the reflectance is reduced accordingly in the second embodiment. However, it is also possible to form a light emitting layer that is made of a material having such a molecular structure as to absorb light of the predetermined wavelengths. By doing so, light of the predetermined wavelengths is absorbed, and a smaller amount of light of the predetermined wavelengths is returned to the outside of the organic EL element.

Next, a third embodiment of the present invention is described. In the first and second embodiments, a pigment that absorbs light of predetermined wavelengths is added to the capping layer or the light emitting layer. In the third embodiment, however, an absorbing layer containing such a pigment is specially provided in an organic EL element.

Figure 12:
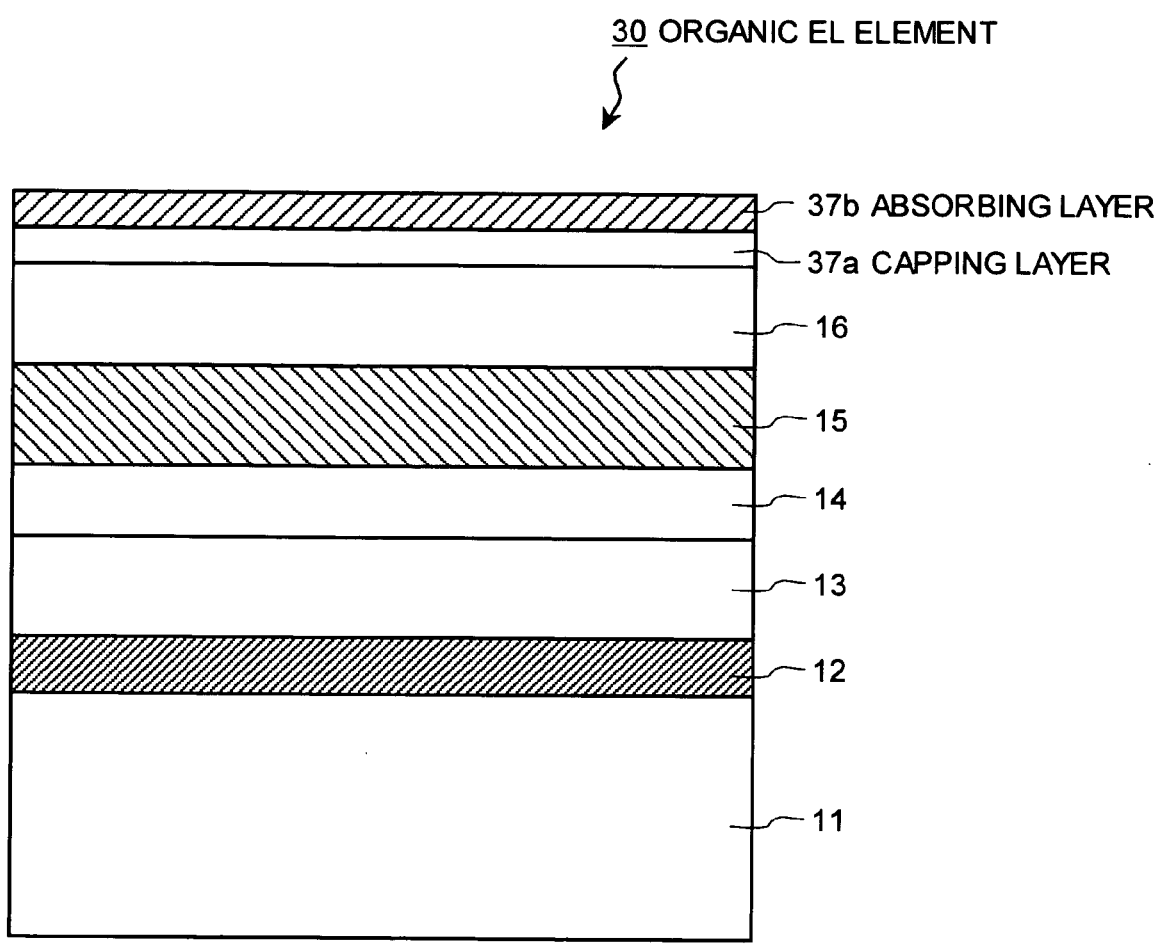
FIG. 12 is cross section of an organic EL element according to a third embodiment of the present invention.

FIG. 12 is the laminated structure of an organic EL element 30 of the third embodiment. The organic EL element 30 of this embodiment has a capping layer 37a and an absorbing layer 37b on the cathode layer 16. The capping layer 37a is formed with a high-refraction film having a higher refractive index than the cathode layer 16 and the light emitting layer 15, and functions as the high-refraction layer mentioned in the claims. Moreover, the absorbing layer 37b, in the same manner as the capping layer 37a, is formed with a high-refraction film having a higher refractive index than the cathode layer 16 and the light emitting layer 15, and has substantially the same refractive index as the capping layer 37a. For example, the capping layer 37a and the absorbing layer 37b are made of zinc sulfide (ZnS), which has a refractive index of 2.38. Accordingly, the amount of light that is totally reflected by the interface between the capping layer 37a and the cathode layer 16, and the amount of light that is totally reflected by the interface between the capping layer 37a and the absorbing layer 37b, are small. In this aspect, the capping layer 37a and the absorbing layer 37b have a function of increasing the light extraction efficiency. The total thickness of the capping layer 37a and the absorbing layer 37b should preferably be 60 nm to 90 nm.

Also, the Nile Red pigment is added to the absorbing layer 37b at a concentration of 10%. As in the first and second embodiments, the Nile Red pigment has a function of absorbing light that is not the red light emitted from the light emitting layer 15, and has a higher reflectance at the interface and a higher luminosity factor than the red light emitted from the light emitting layer 15. Therefore, most of the light that is incident on the absorbing layer 37b is absorbed by the Nile Red pigment contained in the absorbing layer 37b. Accordingly, the amount of light to be returned to the outside of the organic EL element 30 is reduced, and the reflectance of the organic EL element 30 is reduced. In the following, the reflectance and the light extraction efficiency of the organic EL element 30 are described. Also, the reason that the preferred total thickness of the capping layer 37a and the absorbing layer 37b is 60 nm to 90 nm is described.

Figure 13:
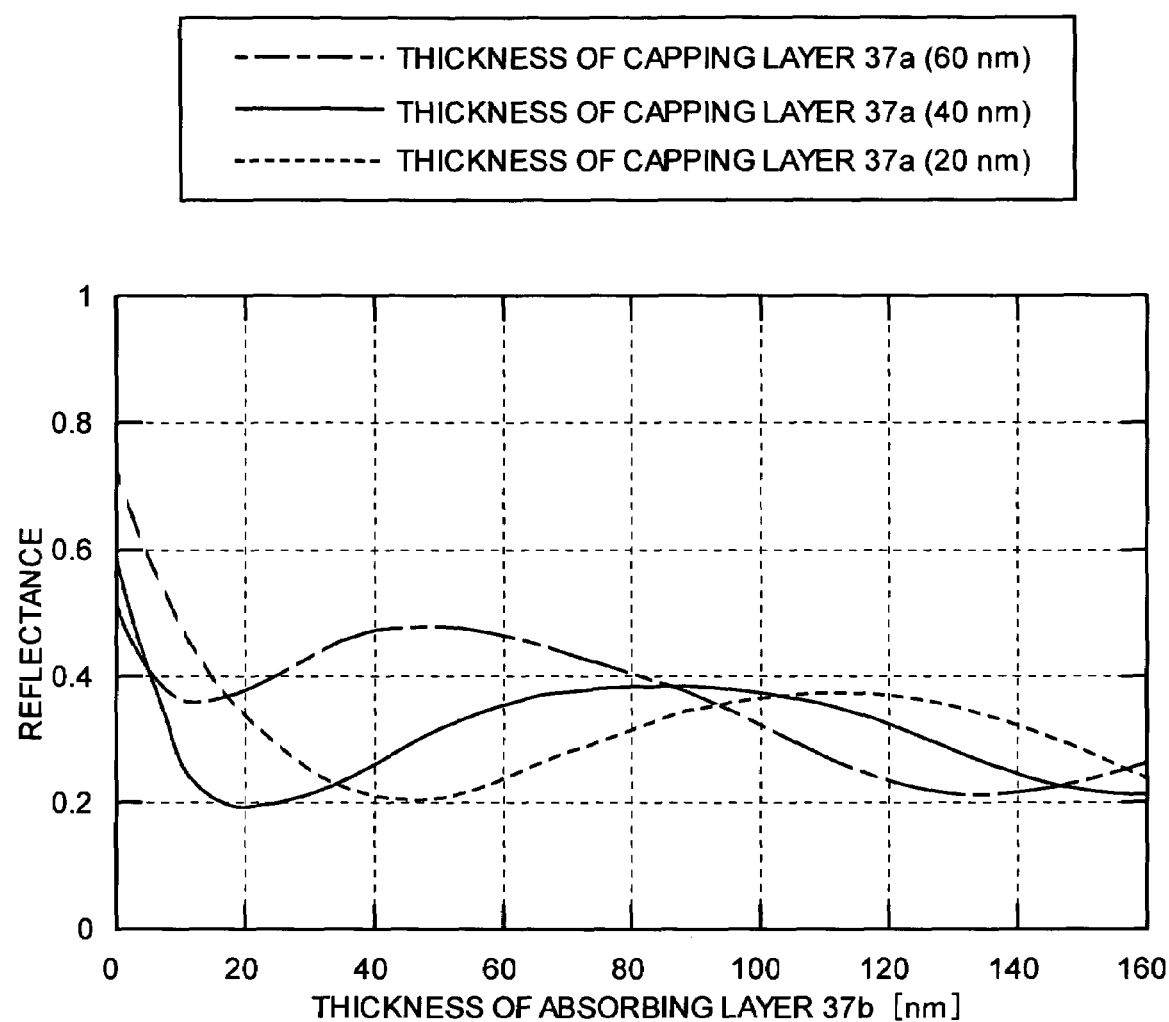
FIG. 13 is a graph for explaining variations in reflectance with thickness of an absorbing layer of the organic EL element shown in FIG. 12.
Figure 14:
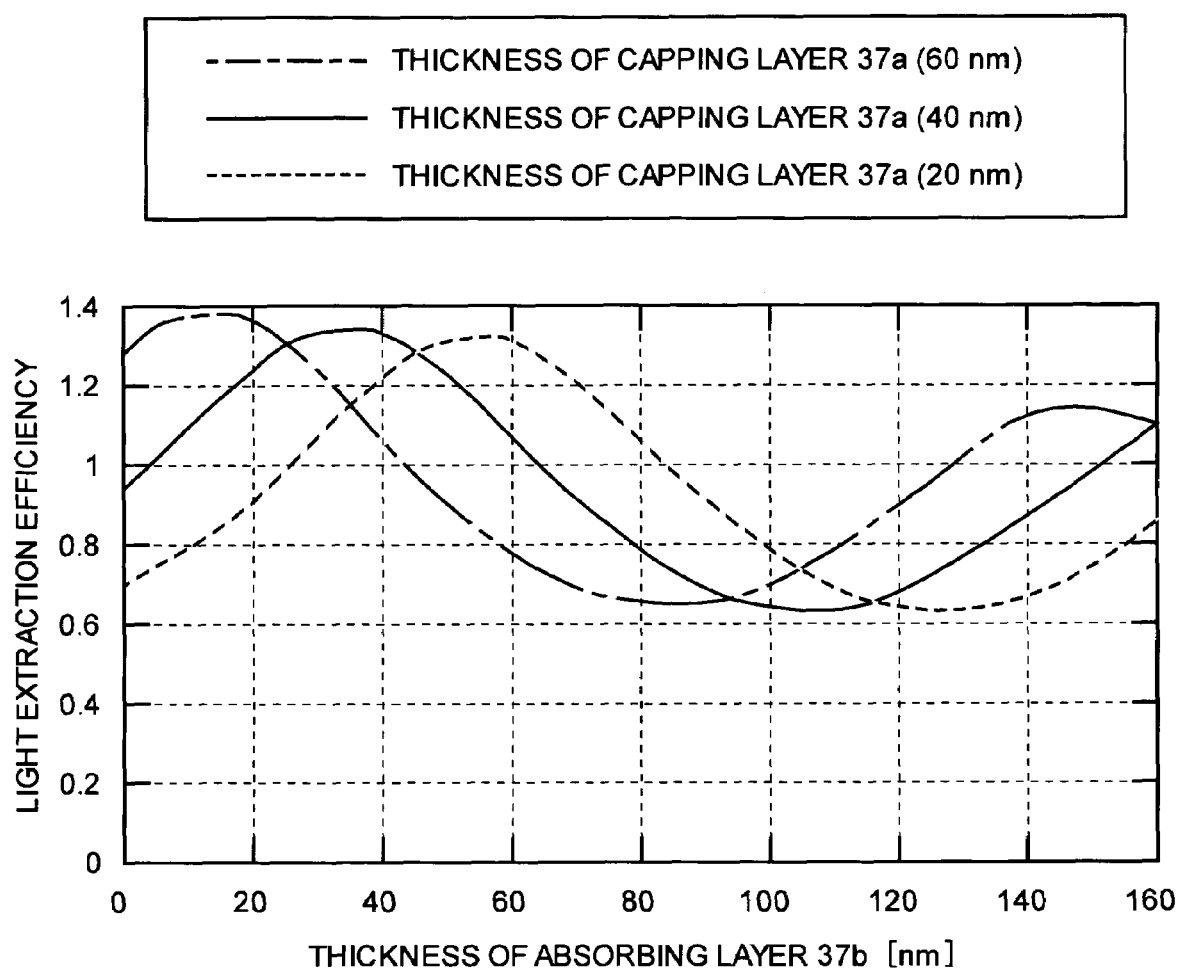
FIG. 14 is a graph for explaining variations in light extraction efficiency with thickness of the absorbing layer of the organic EL element shown in FIG. 12.
Figure 15:
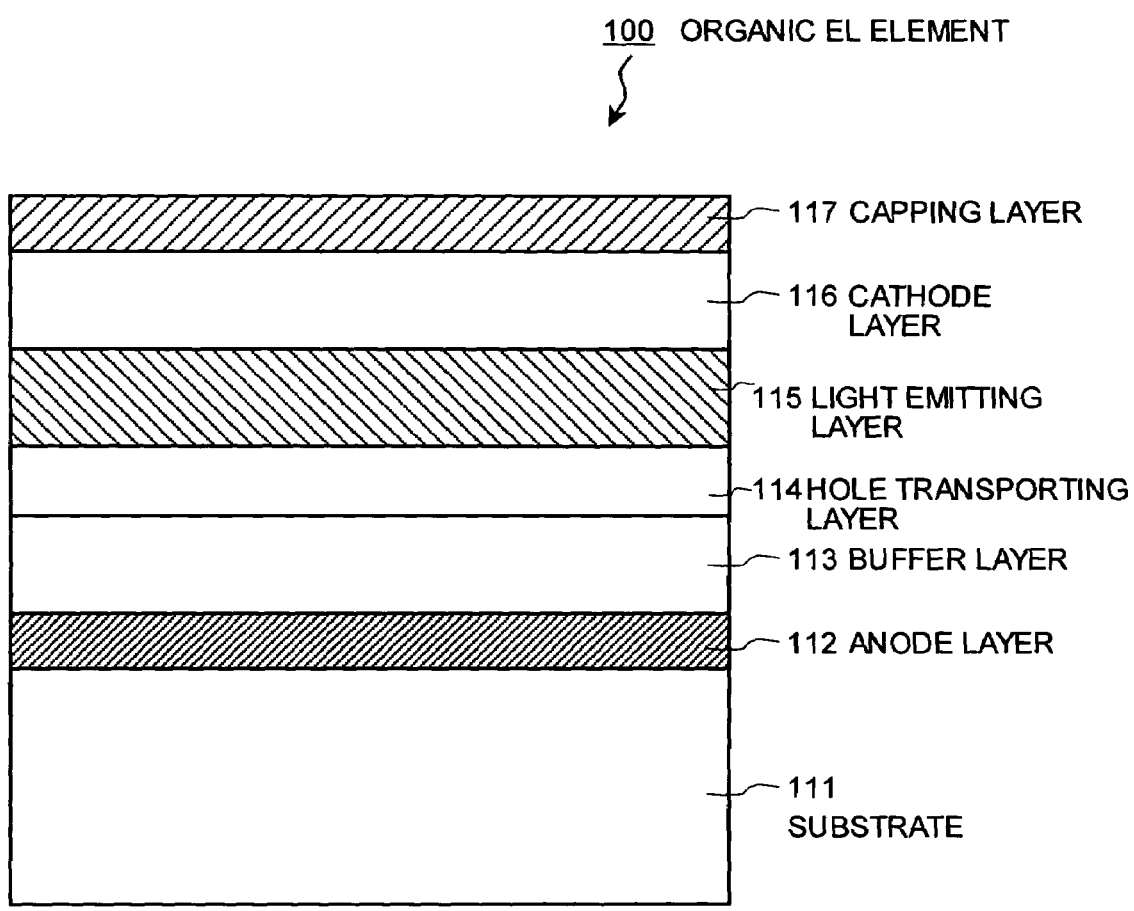
FIG. 15 is cross section of a conventional organic EL element.
Figure 16:
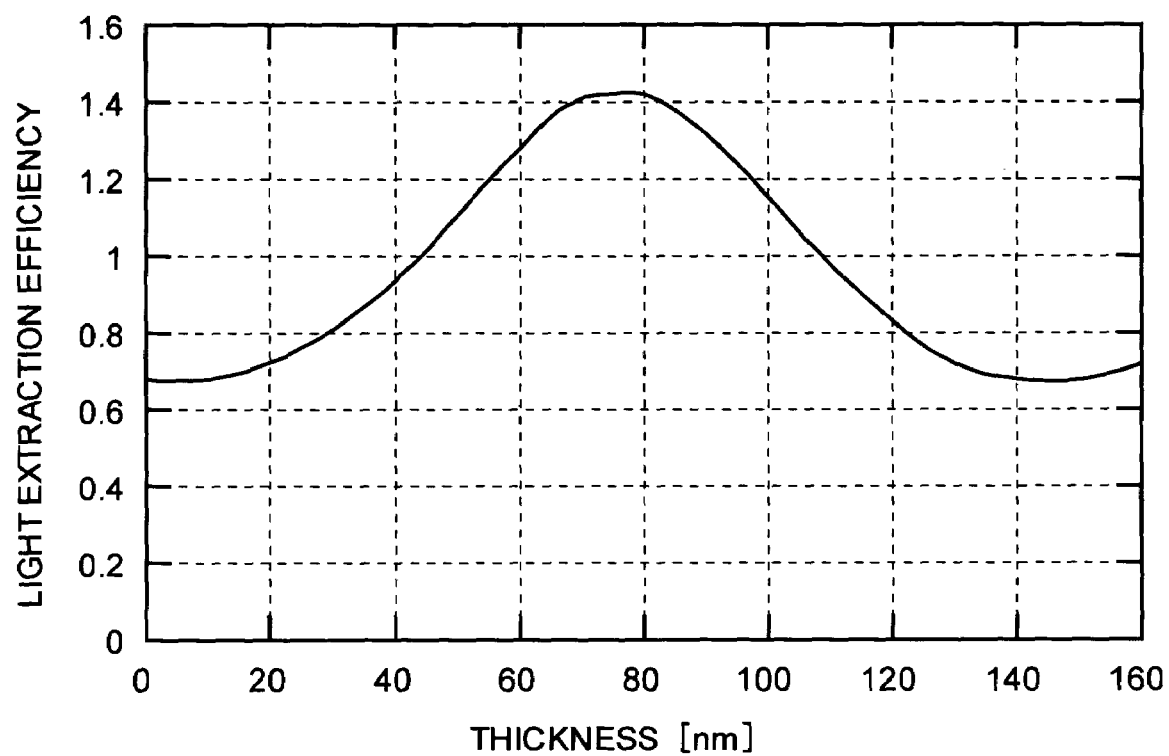
FIG. 16 is a graph for explaining variation in light extraction efficiency with thickness of a capping layer of the conventional organic EL element shown in FIG. 15.
Figure 17:
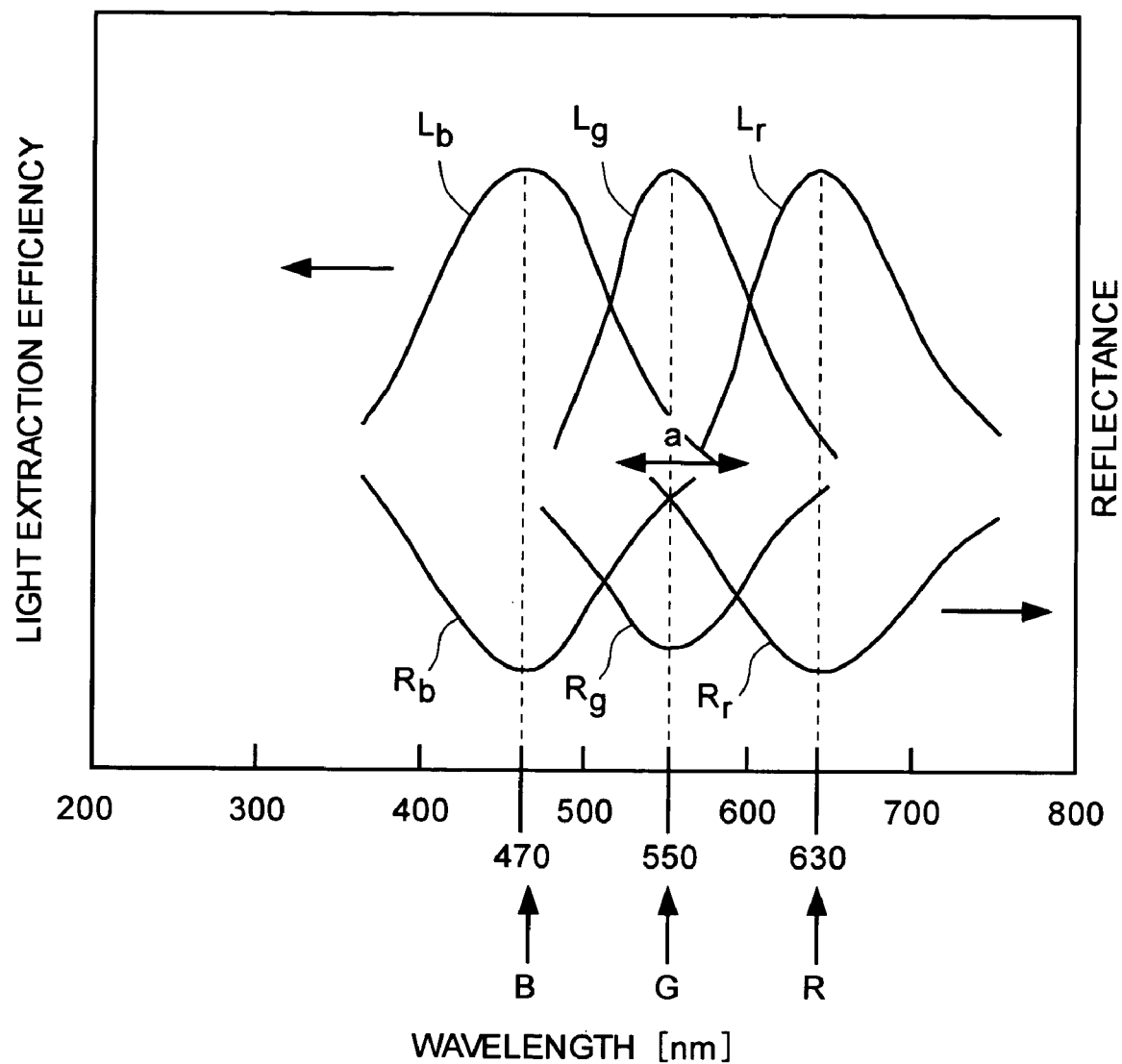
FIG. 17 is a graph for explaining wavelength dependency of light extraction efficiency and reflectance of the conventional organic EL element shown in FIG. 15.
Figure 18:
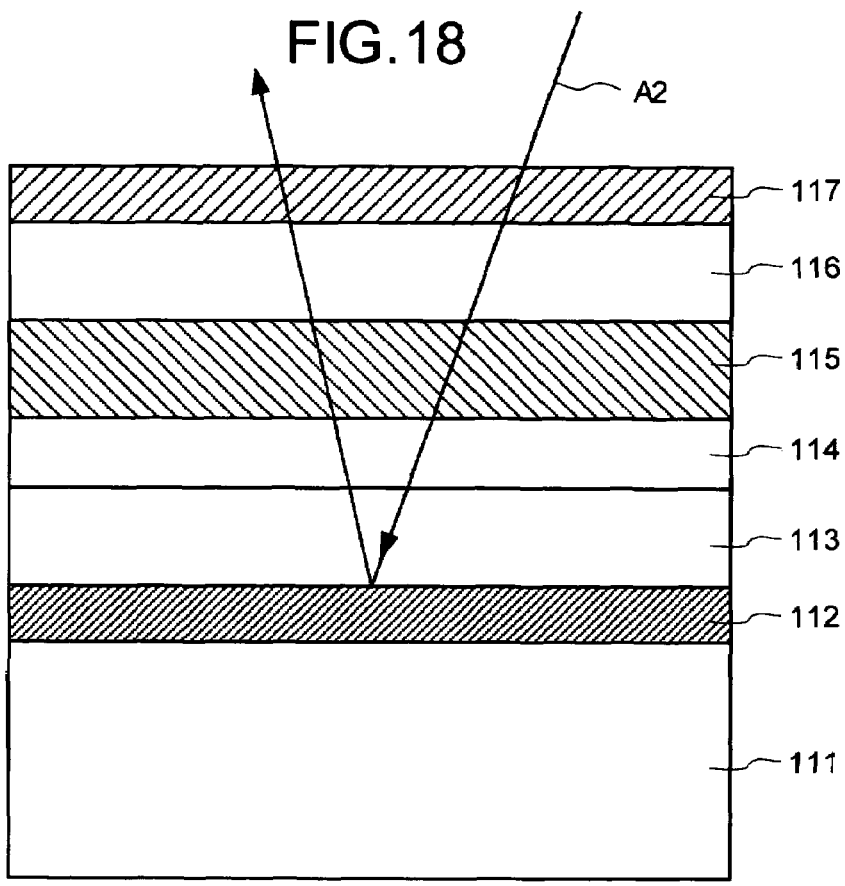
FIG. 18 is a schematic for explaining a transmission path of light that enters the conventional organic EL element shown in FIG. 15.
Figure 19:
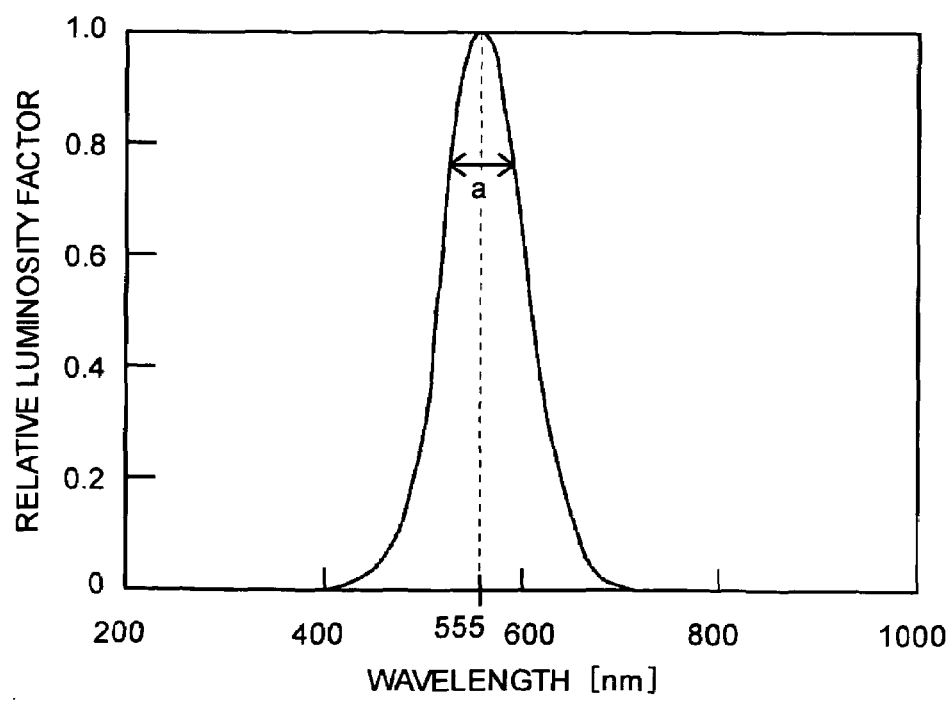
FIG. 19 is a graph for explaining wavelength dependency of relative luminosity factor.
Figure 20:
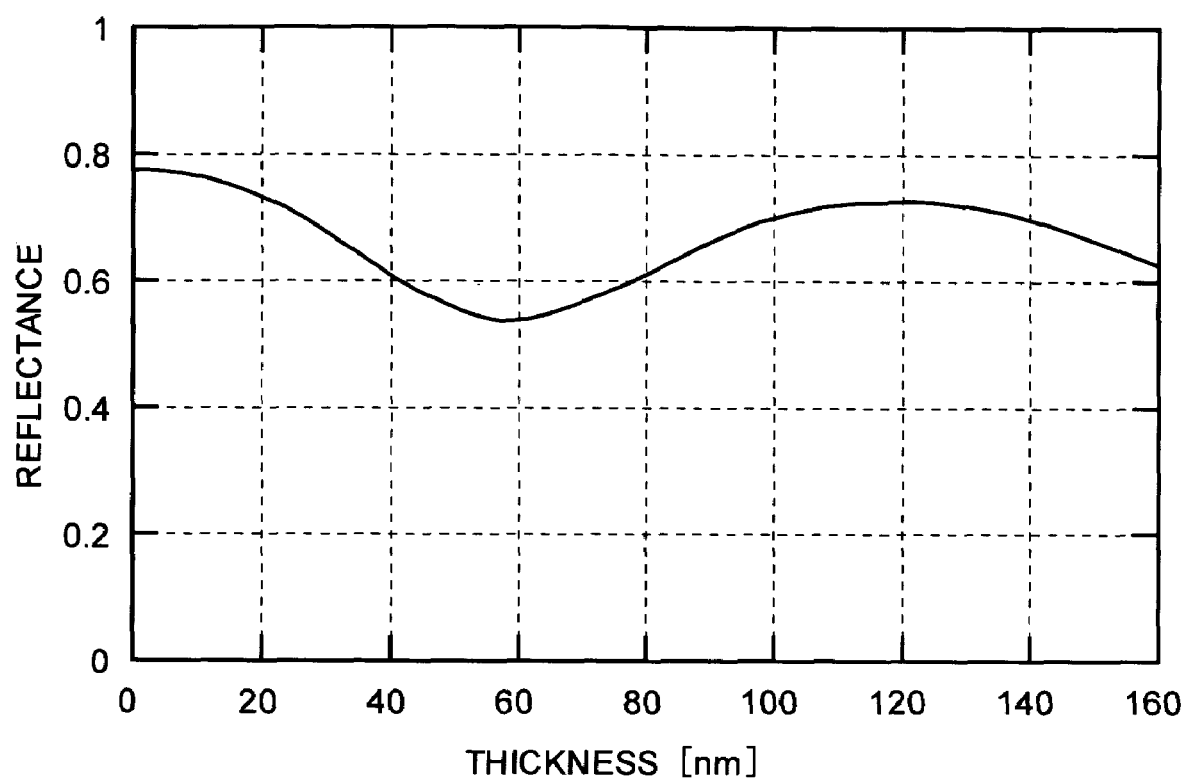
FIG. 20 is a graph for explaining variation in reflectance with thickness of a capping layer of the conventional organic EL element shown in FIG. 15.

FIG. 13 is a graph for explaining variations in reflectance of the organic EL element 30 with the thickness of the absorbing layer 37b when the thickness of the capping layer 37a is 20 nm, 40 nm, and 60 nm. FIG. 14 is a graph for explaining variations in the light extraction efficiency of the organic EL element 30 with the thickness of the absorbing layer 37b when the thickness of the capping layer 37a is 20 nm, 40 nm, and 60 nm. As shown in FIG. 13, the smallest value of the reflectance of the organic EL element 30 is 0.40 or smaller, regardless of the thickness of the capping layer 37a. Considering the fact that a conventional organic EL element has a reflectance of 0.54 or higher, the organic EL element 30 exhibits a low reflectance. As shown in FIG. 14, the greatest value of the light extraction efficiency is 1.30 or greater, regardless of the thickness of the capping layer 37a. Compared with a conventional organic EL element, the organic EL element 30 does not have much lower light extraction efficiency, but maintains rather high light extraction efficiency. In these aspects, the organic EL element 30 of the third embodiment achieves the same effects as the first and second embodiments.

As shown in FIGS. 13 and 14, where the thickness of the capping layer 37a is 60 nm, the reflectance exhibits the largest value of 0.35, and the light extraction efficiency is as high as 1.38, with the thickness of the absorbing layer 37b being 10 nm. Therefore, where the thickness of the capping layer 37a is 60 nm, the absorbing layer 37b can be made thin, and a greater degree of freedom can be allowed in design of the laminated structure. Also, when the total thickness of the capping layer 37a and the absorbing layer 37b is 60 nm to 90 nm, the reflectance is 0.4 or lower, and the light extraction efficiency is 1.2 or higher. Therefore, where the thickness of the capping layer 37a is 60 nm, it is preferable to adjust the thickness of the absorbing layer 37b so that the total thickness of the capping layer 37a and the absorbing layer 37b becomes 60 nm to 90 nm.

With an organic EL element that has a reflectance of 0.25 or lower and a light extraction efficiency of 1.2 or higher, an organic EL display device of even higher quality can be obtained. This is because the intensity of light that can be extracted from such an organic EL element is high, and the reflectance is reduced, thereby preventing degradation of contrast. When the thickness of the capping layer 37a is 40 nm, the thickness of the absorbing layer 37b having a reflectance of 0.25 or lower is 10 nm to 40 nm, and the thickness of the absorbing layer 37b having a light extraction efficiency of 1.2 or higher is 20 nm to 50 nm, as shown in FIGS. 13 and 14. Therefore, the thickness of the absorbing layer 37b having a reflectance of 0.25 or lower and a light extraction efficiency of 1.2 or higher should be 20 nm to 40 nm. Accordingly, the preferred total thickness of the capping layer 37a and the absorbing layer 37b should be 60 nm to 80 nm. When the thickness of the capping layer 37a is 20 nm, the thickness of the absorbing layer 37b having a reflectance of 0.25 or lower is 30 nm to 70 nm, and the thickness of the absorbing layer 37b having a light extraction efficiency of 1.2 or higher is 40 nm to 70 nm, as shown in FIGS. 13 and 14. Therefore, the thickness of the absorbing layer 37b having a reflectance of 0.25 or lower and a light extraction efficiency of 1.2 or higher should be 40 nm to 70 nm. Accordingly, the total thickness of the capping layer 37a and the absorbing layer 37b should preferably be 60 nm to 90 nm. Considering the above facts, the total thickness of the capping layer 37a and the absorbing layer 37b should preferably be 60 nm to 90 nm, where the thickness of the capping layer 37a is 40 nm or 20 nm.

Although it seems to be preferable to increase the thickness of the absorbing layer 37b to reduce the reflectance, the results shown in FIG. 13 indicate that the absorbing layer 37b does not need to be thick. As shown in FIG. 13, the smallest value of the reflectance appears as the thickness of the absorbing layer 37b varies. Although it seems to be preferable to reduce the total thickness of the capping layer 37a and the absorbing layer 37b to shorten the light transmission path and to increase the light extraction efficiency, the results shown in FIG. 14 indicate that the total thickness of the capping layer 37a and the absorbing layer 37b does not need to be very thin. As shown in FIG. 14, the largest value of the light extraction efficiency appears as the thickness of the absorbing layer 37b varies. Therefore, the total thickness of the capping layer 37a and the absorbing layer 37b should preferably be 60 nm to 90 nm, which allows the reflectance to exhibit the minimum value and the light extraction efficiency to exhibit the maximum value. More preferably, the total thickness of the capping layer 37a and the absorbing layer 37b should be 70 nm to 80 nm. In this case, low reflectance and high extraction efficiency can be more certainly maintained than when the total thickness of the capping layer 37a and the absorbing layer 37b is 60 nm to 90 nm. Furthermore, where the total thickness of the capping layer 37a and the absorbing layer 37b is restricted to a narrower range, a greater degree of freedom can be allowed in the design of the laminated structure.

Also, where the thickness of the capping layer 37a is 40 nm or 20 nm, the thickness range of the absorbing layer 37b that exhibits a reflectance of 0.25 or lower and a light extraction efficiency of 1.2 or higher is wider. Accordingly, with the capping layer 37a of 40 nm or 20 nm in thickness, organic EL elements that can prevent an increase in the reflectance and a decrease in the light extraction efficiency can be produced, even if variations are caused in the film thickness of the absorbing layer 37 during the production process.

In this manner, organic EL display devices having reflectance and light extraction efficiency less affected by manufacturing variations can be produced by adjusting the thickness of the capping layer 37a and the absorbing layer 37b according to the third embodiment.

Although the absorbing layer 37b is formed on the capping layer 37a in the third embodiment, the absorbing layer 37b may be formed on the anode layer 12. Most of incident light from outside is reflected by the interface between the anode layer 12 and the buffer layer 13. Therefore, the absorbing layer 37b containing Nile Red may be placed anywhere in the transmission path of the reflected light, so as to prevent the reflected light from returning to the outside and to reduce the reflectance. Also, the capping layer 37a is placed on the cathode layer 16 in the third embodiment. However, the capping layer 37a may be formed anywhere on the light emitting side of the light emitting layer 15. This is because the amount of light reflected by the interface can be reduced by the capping layer 37a located anywhere in the transmission path of the light that is emitted from the light emitting layer 15 and transmitted to the outside of the organic EL element 30. Meanwhile, the refractive index of the capping layer 37a should be higher than the refractive index of the layer in contact with the capping layer 37a on the incident side of the light emitted from the light emitting layer 15. Therefore, when the capping layer 37a is located on the light emission side of the light emitting layer 15, the refractive index of the capping layer 37a should be higher than the refractive index of at least one of the light emitting layer 15 and the layer located on the light emission side of the light emitting layer 15.

In the first through third embodiments, each organic EL element emits the red light. However, each organic EL element may emit the blue light, with the capping layer 17, the light emitting layer 25, or the absorbing layer 37b containing the pigment called Nile Red. In an organic EL element that emits the blue light and includes the capping layer 17, the light emitting layer 25, or the absorbing layer 37b containing Nile Red, most of the 500-560 nm light that excludes the blue light and has a high reflectance at the interface and a high luminosity factor is absorbed by Nile Red and is prevented from traveling outward. Accordingly, the reflectance can be reduced. In this case, the optimum thickness can be smaller, as the wavelength of the light is shorter.

In the first through third embodiments, the capping layer 17, the light emitting layer 25, or the absorbing layer 37b contain Nile Red as an additional material. However, it is possible to employ any material that absorbs light that is not emitted from the light emitting layer 15 or 25 and has a larger proportion of light reflected at the interface than the light emitted from the light emitting layer 15 or 25. With the capping layer 17, the light emitting layer 25, or the absorbing layer 37b each containing such a material, an organic EL element having a lower reflectance can be produced.

Also, when the green light is emitted, instead of the red light or B, an organic EL element may be formed with the capping layer 17, the light emitting layer 25, or the absorbing layer 37b each containing such a material as to absorb light that is not the green light emitted from the light emitting layer and has a larger proportion of light reflected at the layer interface than the green light. Here, the light to be absorbed by such a material is contained in incident light from outside. In this manner, an organic EL element that emits the green light and has a low reflectance can be produced.

In the first through third embodiments, zinc sulfide (ZnS) that has a refractive index of 2.38 is used to form the capping layers 17, 27, and 37a, and the absorbing layer 37b. However, it is possible to employ any other material that exhibits a higher refractive index than the light emitting layer and the layer in contact with the light incident side of the light emitting layer. For example, titanium oxide ($TiO_2$) that has a refractive index of 2.39 or ITO that has a refractive index of 1.95 may be employed. Such a material that has a higher refractive index than the light emitting layer and the layer in contact with the light incident side of the light emitting layer can reduce the total reflection of light at the interface of the layer in contact with the capping layer 17, 27, or 37a or the absorbing layer 37b. Such a material can also increase the light extraction efficiency. With such a material, the reflectance and the light extraction efficiency can be controlled by adjusting the thicknesses of the capping layer 17, 27, or 37a and the absorbing layer 37b in the same manner as in the first through third embodiments. Also, the light emitting layers 15 and 25 also function as electron transporting layers in the first through third embodiments. However, it is possible to employ an electron transporting layer apart from the light emitting layer 15 or 25. In such a case, the optimum thickness might differ from the above, depending on the refractive index.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting element comprising:
a multi-layered structure including a first electrode layer, a second electrode layer and a light emitting layer between the first and the second electrode layers; and
an absorbing layer that is arranged on a side of the light emitting layer from which light is emitted, wherein the absorbing layer has a higher refractive index than at least one layer of the multi-layered structure, and absorbs a different wavelength from light emitted from the light emitting layer,
wherein the absorbing layer contains an additive absorbing the light having a different wavelength from the light emitted from the light emitting layer;
wherein the additive comprises a Nile Red pigment.

2. The light emitting element according to claim 1, wherein the light emitted from the light emitting layer passes through the absorbing layer.

3. The light emitting element according to claim 1, wherein the light emitting layer emits light of red color or blue color; wherein a wavelength of the light absorbed in the absorbing layer is from 500 nm to 560 nm.

4. The light emitting element according to claim 1, wherein the absorbing layer has a higher refractive index than all layers of the multi-layered structure.

5. The light emitting element according to claim 1, wherein the absorbing layer comprises ZnS, $TiO_2$ or ITO.

6. The light emitting element according to claim 1, wherein a concentration of the Nile Red pigment additive is from 5% to 10%.

7. An image display device comprising a plurality of the light emitting elements according to claim 1.

8. The light emitting element according to claim 1, wherein the reflectance of the absorbing layer is lower than 0.54.

9. The light emitting element according to claim 1, wherein the reflectance of the absorbing layer is lower than 0.4.

10. A light emitting element comprising:
a substrate;
a first multi-layered structure on the substrate, including a first electrode layer, a second electrode layer and a light emitting layer between the first and the second electrode layers; and
a second multi-layered structure on the first multi-layered structure, including a absorbing layer and a high-refraction layer, the absorbing layer absorbing light of a different wavelength from light emitted from the light emitting layer, the high-refraction layer having a higher refractive index than at least one layer of the first multi-layered structure,
wherein the absorbing layer contains an additive absorbing the light having a different wavelength from the light emitted from the light emitting layer;
wherein the additive comprises a Nile Red pigment.

11. The light emitting element according to claim 10, wherein a combined thickness of the absorbing layer and the high-refraction layer is from 60 nm to 90 nm.

12. The light emitting element according to claim 10, wherein a concentration of the Nile Red pigment additive is from 5% to 10%.

13. An image display device comprising a plurality of the light emitting elements according to claim 10.

14. A light emitting element comprising:
a substrate;
a multi-layered structure on the substrate, including a first electrode layer, a second electrode layer and a light emitting layer between the first and second electrode layers; and
an absorbing layer arranged on the multi-layered structure, having a higher refractive index than at least one layer of the multi-layered structure, the absorbing layer absorbing light of a different wavelength from light emitted from the light emitting layer,
wherein the absorbing layer contains an additive absorbing the light emitting layer, the additive comprising a Nile Red pigment.

15. The light emitting element according to claim 14, wherein the light emitted from the light emitting layer passes through the absorbing layer.

16. The light emitting element according to claim 14, wherein the light emitting layer emits light of red color or blue color; wherein a wavelength of the light absorbed in the absorbing layer is from 500 nm to 560 nm.

17. The light emitting element according to claim 14, wherein the absorbing layer has a higher refractive index than all layers of the multi-layered structure.

18. The light emitting element according to claim 14, wherein the absorbing layer comprises ZnS, $TiO_2$, or ITO.

19. An image display device comprising a plurality of the light emitting elements according to claim 14.

20. The light emitting element according to claim 14, where a concentration of the Nile Red pigment additive is from 5% to 10%.

21. A light emitting element comprising;
a multi-layered structure including a first electrode layer, a second electrode layer and a light emitting layer between the first and the second electrode layers; and
an absorbing layer that is arranged on a side of the light emitting layer from which light is emitted, wherein the absorbing layer has a higher refractive index than at least one layer of the multi-layered structure, and contains a Nile Red pigment absorbing a different wavelength of the light from the light emitted from the light emitting layer.

* * * * *